United States Patent
Kawano

(10) Patent No.: US 9,722,625 B2
(45) Date of Patent: *Aug. 1, 2017

(54) SEMICONDUCTOR DEVICE AND SEMICONDUCTOR DEVICE OPERATING METHOD

(71) Applicant: Renesas Electronics Corporation, Tokyo (JP)

(72) Inventor: Takahiro Kawano, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/080,242

(22) Filed: Mar. 24, 2016

(65) Prior Publication Data

US 2016/0204792 A1 Jul. 14, 2016

Related U.S. Application Data

(63) Continuation of application No. 14/267,790, filed on May 1, 2014, now Pat. No. 9,306,593.

(30) Foreign Application Priority Data

May 30, 2013 (JP) .................................. 2013-114404

(51) Int. Cl.
*H03M 1/12* (2006.01)
*H03M 1/50* (2006.01)

(52) U.S. Cl.
CPC .................................. *H03M 1/502* (2013.01)

(58) Field of Classification Search
CPC ........... H03M 1/502; H03M 1/60; H03M 1/12

(Continued)

(56) References Cited

U.S. PATENT DOCUMENTS 7,061,292 B2 6/2006 Maksimovic et al.
7,106,239 B1 * 9/2006 Keskin .................. G04F 10/005
341/155

(Continued)

FOREIGN PATENT DOCUMENTS

JP 4545439 B2 9/2010
JP 4575420 B2 11/2010

OTHER PUBLICATIONS

Notice of Allowance dated Dec. 3, 2015 in U.S. Appl. No. 14/267,790.

(Continued)

*Primary Examiner* — Linh Nguyen
(74) *Attorney, Agent, or Firm* — McGinn IP Law Group, PLLC

(57) ABSTRACT

A semiconductor device includes an analog-digital converter circuit. The analog-digital converter circuit includes a delay cell array that includes n-number (n is a natural number of 2 or more) of serially-coupled delay cells, receives a reference clock signal, and utilizes an analog input signal as the power supply voltage for delay cells in each stage, and an encoder that encodes the output signal of the delay cells in each stage of the delay cell array. The n number of delay cells include a delay quantity weighted for each delay cell, and the encoder encodes the output signal of the delay cell in each stage of the delay cell array by weighting corresponding to the number of delay cell stages. The delay cells output signal without changing polarity of inputted signals.

13 Claims, 16 Drawing Sheets

(58) Field of Classification Search
USPC .................................. 341/155, 157, 167
See application file for complete search history.

(56) References Cited

U.S. PATENT DOCUMENTS

| | | | | |
|---|---|---|---|---|
| 7,268,719 | B2* | 9/2007 | Terazawa | G04F 10/005 341/155 |
| 7,450,049 | B2 | 11/2008 | Yamauchi | |
| 7,525,471 | B2* | 4/2009 | Prodi | H03M 1/502 341/155 |
| 7,782,241 | B2* | 8/2010 | Kudo | H03M 1/504 341/155 |
| 7,864,093 | B2* | 1/2011 | Oba | G01R 25/005 327/161 |
| 8,164,318 | B2* | 4/2012 | Sasaki | H02M 3/157 323/222 |
| 9,306,593 | B2* | 4/2016 | Kawano | H03M 1/502 |
| 2006/0055574 | A1* | 3/2006 | Maksimovic | G04F 10/005 341/155 |
| 2006/0290555 | A1* | 12/2006 | Watanabe | H03M 1/0612 341/155 |
| 2009/0021407 | A1* | 1/2009 | Terazawa | H03M 1/502 341/122 |
| 2009/0131010 | A1* | 5/2009 | Oshima | H03M 1/122 455/334 |
| 2009/0135040 | A1* | 5/2009 | Watanabe | H03K 5/133 341/157 |
| 2009/0146630 | A1 | 6/2009 | Naka | |
| 2010/0026545 | A1* | 2/2010 | Delagnes | G04F 10/005 341/156 |

OTHER PUBLICATIONS

Final Office Action dated Jul. 8, 2015 in U.S. Appl. No. 14/267,790.
Non-Final Office Action dated Feb. 9, 2016 in U.S. Appl. No. 14/267,790.

* cited by examiner

FIG. 4

| | | A/D CONVERSION OUTPUT 206 | 0 | 256 | 384 | 448 | 480 | 481 | X | 544 | 576 | 640 | 768 | 1024 |
|---|---|---|---|---|---|---|---|---|---|---|---|---|---|---|
| BINARY CONVERSION ENCODER 300 INPUT | Q769 TO Q1024 | | 0 | 0 | 0 | 0 | 0 | 0 | 0 | 0 | 0 | 0 | 0 | 1 |
| | Q641 TO Q768 | | 0 | 0 | 0 | 0 | 0 | 0 | 0 | 0 | 0 | 0 | 1 | 1 |
| | Q577 TO Q640 | | 0 | 0 | 0 | 0 | 0 | 0 | 0 | 0 | 0 | 1 | 1 | 1 |
| | Q545 TO Q576 | | 0 | 0 | 0 | 0 | 0 | 0 | 0 | 0 | 1 | 1 | 1 | 1 |
| | Q544 | | 0 | 0 | 0 | 0 | 0 | 0 | 0 | 1 | 1 | 1 | 1 | 1 |
| | QB | | 0 | 0 | 0 | 0 | 0 | 0 | QX | 1 | 1 | 1 | 1 | 1 |
| | Q481 | | 0 | 0 | 0 | 0 | 0 | 1 | 1 | 1 | 1 | 1 | 1 | 1 |
| | Q449 TO Q480 | | 0 | 0 | 0 | 0 | 1 | 1 | 1 | 1 | 1 | 1 | 1 | 1 |
| | Q385 TO Q448 | | 0 | 0 | 0 | 1 | 1 | 1 | 1 | 1 | 1 | 1 | 1 | 1 |
| | Q257 TO Q384 | | 0 | 0 | 1 | 1 | 1 | 1 | 1 | 1 | 1 | 1 | 1 | 1 |
| | Q1 TO Q256 | | 0 | 1 | 1 | 1 | 1 | 1 | 1 | 1 | 1 | 1 | 1 | 1 |
| WEIGHTING ENCODER 290 INPUT | q1024 | | 0 | 0 | 0 | 0 | 0 | 0 | 0 | 0 | 0 | 0 | 0 | 1 |
| | q768 | | 0 | 0 | 0 | 0 | 0 | 0 | 0 | 0 | 0 | 0 | 1 | 1 |
| | q640 | | 0 | 0 | 0 | 0 | 0 | 0 | 0 | 0 | 0 | 1 | 1 | 1 |
| | q576 | | 0 | 0 | 0 | 0 | 0 | 0 | 0 | 0 | 1 | 1 | 1 | 1 |
| | q544 | | 0 | 0 | 0 | 0 | 0 | 0 | 0 | 1 | 1 | 1 | 1 | 1 |
| | qA | | 0 | 0 | 0 | 0 | 0 | 0 | qX | 1 | 1 | 1 | 1 | 1 |
| | q481 | | 0 | 0 | 0 | 0 | 0 | 1 | 1 | 1 | 1 | 1 | 1 | 1 |
| | q480 | | 0 | 0 | 0 | 0 | 1 | 1 | 1 | 1 | 1 | 1 | 1 | 1 |
| | q448 | | 0 | 0 | 0 | 1 | 1 | 1 | 1 | 1 | 1 | 1 | 1 | 1 |
| | q384 | | 0 | 0 | 1 | 1 | 1 | 1 | 1 | 1 | 1 | 1 | 1 | 1 |
| | q256 | | 0 | 1 | 1 | 1 | 1 | 1 | 1 | 1 | 1 | 1 | 1 | 1 |

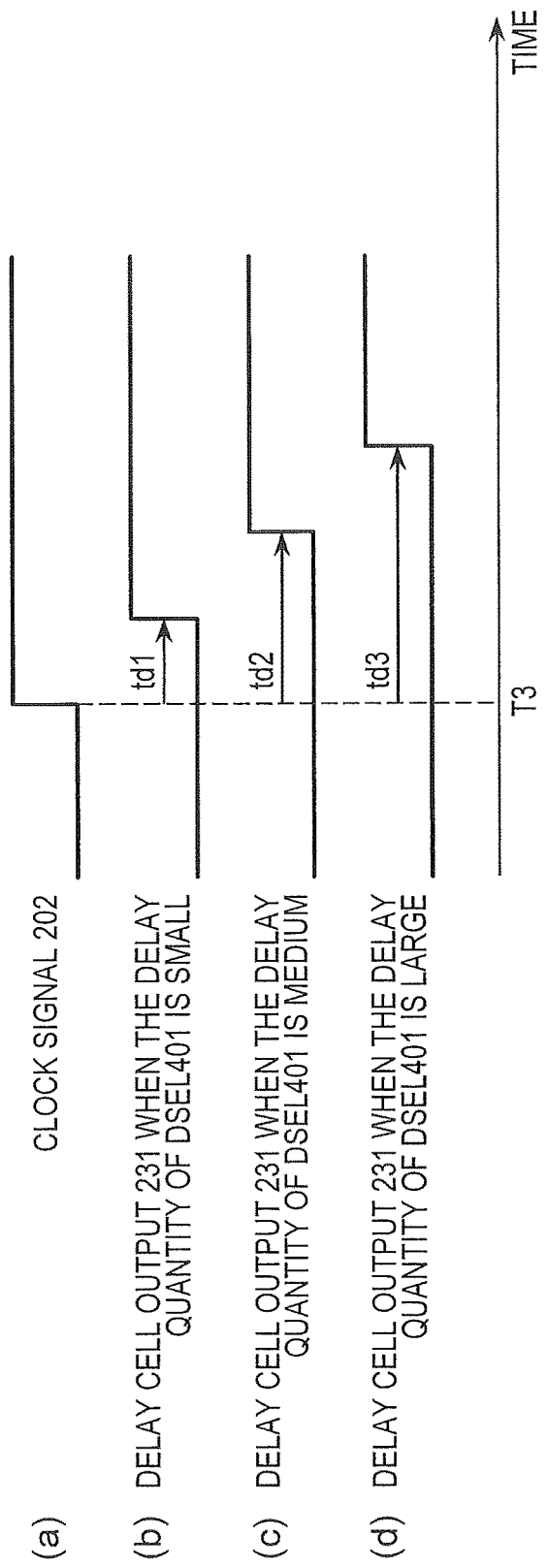

SEMICONDUCTOR DEVICE AND SEMICONDUCTOR DEVICE OPERATING METHOD

CROSS-REFERENCE TO RELATED APPLICATIONS

The present application is a Continuation Application of U.S. patent application Ser. No. 14/267,790, filed on May 1, 2014, which is based on Japanese Patent Application No. 2013-114404 filed on May 30, 2013 including the specification, drawings and abstract is incorporated herein by reference in its entirety.

BACKGROUND

The present invention relates to a semiconductor device, and that is effective when utilized in circuits for example performing analog-digital conversion.

Recent years have seen much progress in the miniaturizing of electronic devices such as handheld devices which have increased demands for miniaturizing and energy-saving of components mounted in these types of electronic devices. On the other hand, developments in information processing technology have also increased needs for higher accuracy in analog-digital converters that convert analog signals to digital signals. There is accordingly an increasing need for small and high-accuracy analog-digital converter.

One technology for analog-digital conversion that allows miniaturization is known as time-to-digital-converter (TDC). A voltage controller is disclosed for example in Japanese Patent Registration No. 4545439 (corresponding to International Patent Application Publication No. WO003050637 (A2)). This voltage controller includes an analog-digital converter (ADC), a compensator (300), and a modulator (400). The analog-digital converter (ADC) converts analog inputs to digital inputs. The compensator (300) contains a lookup table (302), and sets the digital control signal (154) based on the digital error signal. The modulator (400) supplies a power supply control signal (156) in response to the digital control signal that was set. This voltage controller regulates the output voltage of the switching power converter that has a switching period. The analog-digital converter (ADC) includes a delay line analog-digital converter (700) containing a delay cell array (740). The delay cell array (740) contains plural delay line cells. A detection voltage supply (108) coupled to the delay line analog-digital converter is provided in order to sample the detection voltage once during each switching period of the switching power converter. A reference voltage supply (106) coupled to the delay line analog-digital converter is provided. A test voltage supply (704) coupled to the delay line analog-digital converter is provided. A switch is provided to synchronize the detection voltage and reference voltage with the switching period of the switching power converter, and selectively supply the voltages to the delay line analog-digital converter. Plural taps (752, 754) are provided to measure the extent of propagation of the test signal along the delay line. A calibrator is provided. The calibrator sets the difference between the extent of propagation of the test signal along the delay line when a reference voltage was supplied to the delay line analog-digital converter, and the extent of propagation of the test signal along the delay line when a detection voltage was supplied to the delay line analog-digital converter; within the switching period of the switching power converter. A digital error signal indicating the difference between the detection voltage and the reference voltage is then supplied. A calibrator is provided to set the difference between the extent of propagation of the test signal along the delay line when a reference voltage was supplied to the delay line analog-digital converter, and the extent of propagation of the test signal along the delay line when a detection voltage was supplied to the delay line analog-digital converter; within the switching period of the switching power converter, and supply a digital error signal indicating the difference between the detection voltage and the reference voltage. The relevant digital error signal is supplied to the compensator in order to set the digital control signal. Each of the delay cells in the delay line analog-digital converter is reset within the switching period of the switching power converter.

A related technology for a semiconductor device is disclosed in Japanese Patent Registration No. 4575420 (corresponding to U.S. Patent Application Publication No. US2009146630 (A1)). This semiconductor device includes a switching power supply circuit, a digital control circuit, and a dead-time setter circuit. The switching power circuit includes two semiconductor switching elements coupled in series. The digital control circuit supplies the switching pulses to the semiconductor switching elements in order to switch the semiconductor switching elements on and off. The dead-time setter circuit sets the dead time in which both of the two semiconductor switching elements are off. The dead-time setter circuit includes a delay generator circuit, a selector circuit, and a delay adjuster circuit. The delay generator circuit contains plural delay elements whose delay values are mutually different and coupled in series from the initial stage to the final stage in the order of small delay value, and whose total delay value is smaller than the pulse signal cycle input to the initial stage. The delay generator circuit delays the rising edge of the output signal of each delay element by conveying the pulse signal in sequence from the initial stage to the final stage, relative to the rising edge of the pulse signal, to generate pulse edges where the cycle of the pulse signal is split into plural cycles. The selector circuit is input by the output signals of each delay element, and outputs one output signal selected from among the output signals to the digital control circuit as a signal for setting the dead time. The delay adjuster circuit selects an output signal from among the output signals from each delay element, to set the duty cycle of the switching pulse to a minimum, and outputs that (output) signal to the selector circuit.

SUMMARY

The above described analog-digital converter (ADC) of the voltage controller has the following problems. The higher the analog-digital conversion accuracy required in the analog-digital converter (ADC), the larger the circuit scale needed by the delay cell array (740) and the flip-flop group (750), and the circuit scale of the entire analog-digital converter (ADC) became large. Therefore, the higher the analog-digital conversion accuracy, the larger the increase in the circuit surface area so that miniaturizing the components and reducing the circuit scale was impossible.

The reasons why the above types of problems occur in the above described analog-digital converter (ADC) of the voltage controller are as follows. When for example the accuracy of the analog-digital converter (ADC) is 10 bits, the delay cell for the delay cell array (740) and the flip-flops for the flip-flop group (750) each require $2^{10}$=1024 units. The outputs from these flip-flops are input unchanged to the encoder circuit (730) and the bit accuracy increases. Therefore the higher the bit accuracy, the more the number of delay cells and flip-flops increases in the analog-digital converter (ADC), and the larger the surface area of the encoder circuit becomes. The circuit scale of this analog-digital converter (ADC) consequently becomes larger along with the increase in bit accuracy. Technology is therefore needed that is capable of performing high accuracy analog-digital conversion in small scale circuit.

Other issues and novel features of the invention will become apparent from the description in the specifications of the present invention and the accompanying drawings.

According to an aspect of the invention, the semiconductor device includes an analog-digital converter circuit utilizing time-digital conversion technology (TDC). This analog-digital converter circuit contains plural stages of delay cells having weighted delay quantities, and weighting encoder. This encoder encodes weighting signals output from the each stage of the delay cells by weighting that corresponds to the number of stages of the delay cells.

According to the aspect of the invention, high accuracy analog-digital conversion can be performed in a small scale circuit.

BRIEF DESCRIPTION OF THE DRAWINGS

FIG. 4 is a truth table for the weighting encoder input, the binary conversion encoder input, and the analog-digital conversion output signal in the first embodiment;

FIG. 6 is a timing chart showing an example of the operation of the analog-digital converter of the second embodiment;

DETAILED DESCRIPTION

The semiconductor device and the operation method of the semiconductor device of the present embodiment are described next while referring to the accompanying drawings.

First Embodiment

Figure 1:
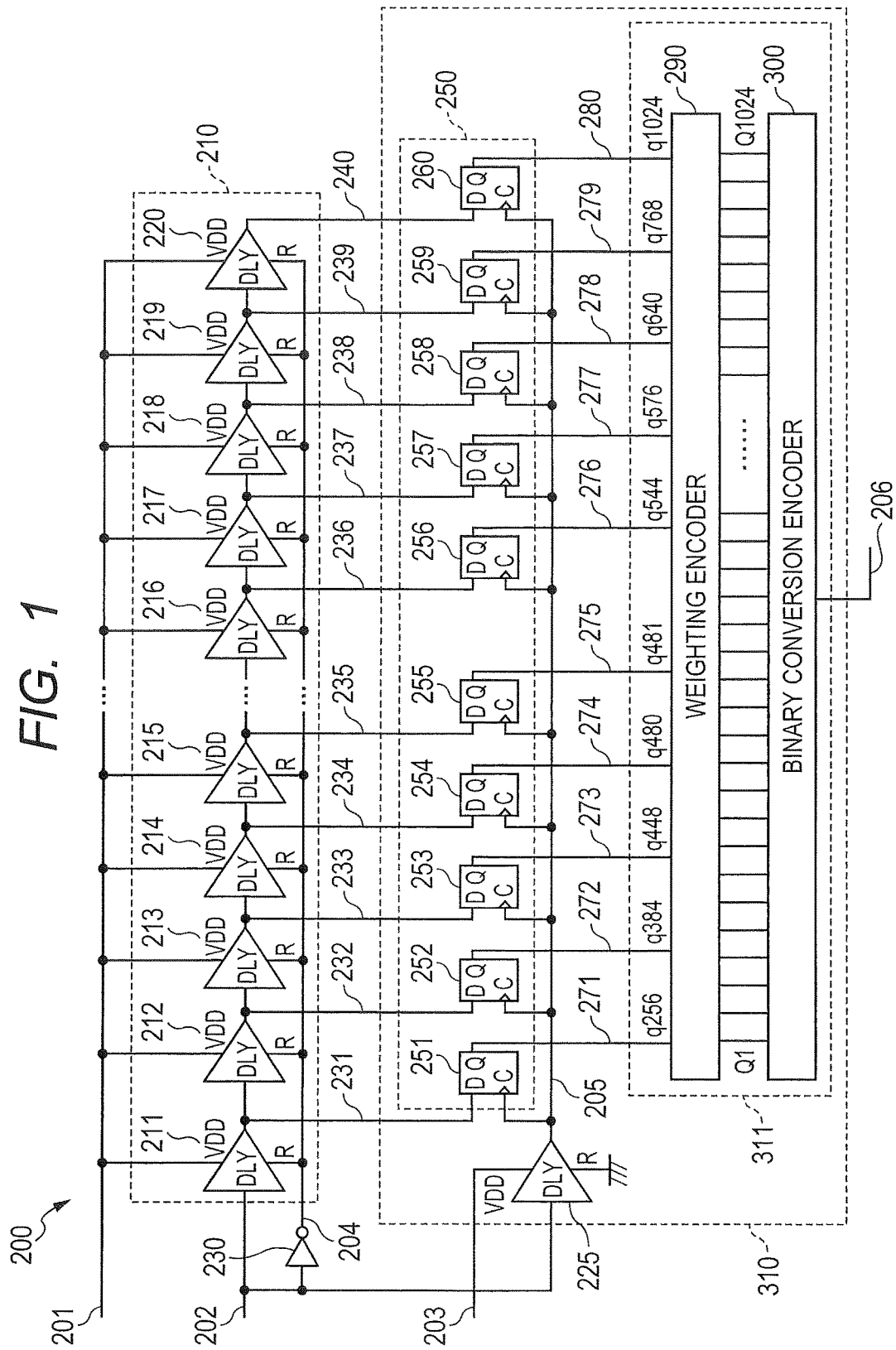
FIG. 1 is a block diagram showing an example of the structure of the analog-digital converter of a first embodiment.

The structure of the semiconductor device containing the analog-digital converter of the present embodiment is described next. FIG. 1 is a block diagram showing an example of the structure of the analog-digital converter 200 of the present embodiment. The analog-digital converter 200 contains a delay cell array 210 and an encoder 310.

The delay cell array 210 includes n number of serially coupled delay cells 211 to 220 (n stage: n is a natural number of 2 or more). The delay cell array 210 is input by a (reference) clock signal 202, and utilizes an analog input signal 201 as the power supply voltage for each stage of the delay cells 211, ..., 220. The encoder 310 encodes the delay cell output signals 231, ..., 240 of each stage of the delay cells 211, ..., 220 of the delay cell array 210 and outputs these encoded signals as the analog-digital conversion output signal 206 (digital output signal). However, n number of the delay cells 211 to 220 include delay quantities weighted for each of the delay cells 211, ..., 220. The encoder 310 encodes the delay cell output signals 231, ..., 240 for each stage of the delay cells 211, ..., 220 of the delay cell array 210 by weighting corresponding to the number of stages of delay cells 211, ..., 220.

The n number of delay cells 211 to 220 of the present embodiment contain delay quantities weighted for each of the delay cells 211, ..., 220. Restated in other words, the n number of delay cells 211 to 220 have different delay quantities for each of the delay cells 211, ..., 220 (however these may partially contain identical amounts of the delay quantities). Therefore, delay cells having a large delay quantity contain delay quantities corresponding to plural bits. Here, a delay cell is defined as containing a delay quantity corresponding to one bit as a unit delay cell, and a delay cell is defined as containing a delay quantity corresponding to plural bits as one delay cell which functions identical to plural unit delay cells. Hence, in the present embodiment, jointly utilizing delay cells having a large delay quantity and not just unit delay cells, allows reducing the number of delay cells compared to when utilizing only unit delay cells. In other words, the circuit surface area of the delay cell array 210 can be reduced. Moreover, as the number of delay cells is reduced, the number of signal input to the encoder 310 can also be reduced so that processor circuits for processing these signals can also be reduced. The present embodiment can in this way reduce the circuit surface area of the encoder 310. Further, as the number of processor circuit and number of delay cells are reduced, the number of elements within the delay cell array 210 and the encoder 310 can be reduced. The present embodiment can in this way reduce the power consumption. Moreover, as the number of elements is reduced, the wiring layout becomes simpler so that circuit design is easier to accomplish.

Hereafter, an example of an analog-digital converter 200 having 10-bit conversion accuracy is described.

The delay cell array 210 contains the delay cells 211 to 220 coupled in series. The delay cells 211 to 220 contain different delay quantities. However, a portion of the delay cells 211 to 220 may contain identical delay quantities. For example, a delay cell 215 is set to a delay cell (unit delay cell) having a delay quantity 1. A delay cell 216 is set to a delay cell having a delay quantity 1. The delay cell 214 and delay cell 217 are set to delay cells having a delay quantity 32 times larger than that of the delay cell 215. A delay cell 213 and delay cell 218 are set to delay cells having the delay quantity 64 times larger than that of delay cell 215. A delay cell 212 and delay cell 219 are set to delay cells having a delay quantity 128 times larger than that of the delay cell 215. A delay cell 211 and delay cell 220 are set to delay cells having a delay quantity 256 times larger than that of the delay cell 216. However in the present embodiment, the delay quantities of each delay cell are only examples, and each delay cell may contain different another delay quantities.

The delay cell 211 is input by the analog input signal 201, clock signal 202, and the inverted clock signal 204 generated by the inverter 230 that logically inverted the clock signal 202, and outputs the delay cell output signal 231. However, the analog input signal 201 and the inverted clock signal 204 are input to the power supply node of the delay cell 211. The clock signal 202 is input to the input node of the delay cell 211. A delay cell output signal 231 which is a clock signal 202 delayed by a delay quantity of the delay cell 211 is output from the output node of the delay cell 211.

The delay cell 212 is input by the analog input signal 201, inverted clock signal 204, and delay cell output signal 231, and output a delay cell output signal 232. However, the analog input signal 201 and the inverted clock signal 204 are input to the power supply nodes of the delay cell 212. The delay cell output signal 231 is input to the input node of the delay cell 212. A delay cell output signal 232 which is a delay cell output signal 231 delayed by the delay quantity of the delay cell 212 is output from the output node of the delay cell 212.

In the same way, an analog input signal 201, inverted clock signal 204, and the delay cell output signals 232 to 239 are respectively input to the delay cells 213 to 220 (70 units), and the delay cells 213 to 220 respectively output the delay cell output signals 233 to 240. However, the analog input signal 201 and the inverted clock signal 204 are input to the power supply nodes of the delay cells 213 to 220. The delay cell output signals 232 to 239 are input to each of the input nodes of the delay cells 213 to 220. The delay cell output signals 233 to 240 which are delay cell output signals 232 to 239 delayed by the delay quantity of the delay cells 213 to 220 are output from the respective output nodes of the delay cells 213 to 220.

Though omitted in the description for the example in FIG. 1, there are 62 delay cell units between the delay cell 215 and the delay cell 216. Therefore, 72 delay cell units are provided. There are 62 delay cells output signals corresponding to the 62 delay cells between the delay cell output signal 235 and the delay cell output signal 236. Accordingly, there are 72 output signals from the delay cells. Among the 64 outputs from the delay cell output signals 235 to delay cell output signal 236, the N-th output is denoted as the delay cell output signal 235-N. Namely, the delay cell output signal 235 and the delay cell output signal 235-1 indicate the same output signal, and the delay cell output signal 236 and the delay cell output signal 235-64 indicate the same output signal.

The encoder 310 includes a latch array 250 and a latch signal encoder 311. The latch array 250 includes plural flip-flops 251 to 260. Each of the plural flip-flops 251 to 260 are provided corresponding to each of the plural delay cells 211 to 220. The plural flip-flops 251 through 260 latch the delay cell output signals 231 to 240 of the plural delay cells 211 to 220 in response to the joint delay clock signal 205. Though omitted in the description for the example in FIG. 1, there are 62 flip-flops between the flip-flop 255 and the flip-flop 256. Therefore, 72 flip-flops are provided the same as the delay cells.

The delay clock signal 205 here is a signal where the clock signal 202 is delayed by the delay circuit 225. The delay circuit 225 is supplied with a reference voltage 203 as the power supply voltage. The delay quantity of the delay circuit 225 is set beforehand so that the analog signal (analog input signal 201) can be correctly converted into a digital signal (analog-digital conversion output signal 206). Also, the flip-flops 251 to 260 are provided equidistantly from the delay circuit 225 so that the delay clock signal 205 is supplied at the same timing.

The delay cell output signal 231 is input to the flip-flop 251 as a data input and the delay clock signal 205 is input as a clock input; and the flip-flop 251 outputs a latch signal 271. In the same way, the flip-flops 252 to 260 (71 units) are respectively input with the delay cell output signals 232 to 240 as data inputs and input with the delay clock signal 205 as the clock input, and the flip-flops 251 to 260 respectively output the latch signals 272 to 280. The flip-flops 251 to 260 are preferably provided in this way immediately after the respective delay cells 211 to 220, since effects such as wiring delays and parasitic capacitance on the delay cell output signals 232 to 240 from the delay cells 211 to 220 can be suppressed and the delay cell output signals 231 to 240 from the flip-flops 251 to 260 can be easily received at an appropriate timing.

The latch signal encoder 311 encodes the latch signals 271, . . . , 280 from each stage of the flip-flops 251, . . . , 260 of the latch array 250 by weighting corresponding to the number of stage of the delay cell 211, 220 (number showing what number counting from delay cell 211). The latch signal encoder 311 contains the weighting encoder 290 and the binary conversion encoder 300.

The weighting encoder 290 outputs the encoded signals Q1 to Q1024 that the latch signals 271, . . . , 280 from each stage of the flip-flop 251, . . . , 260 of the latch array 250 for encoding by weighting that corresponds to the number of stages of the delay cells 211, . . . , 220 (number showing what number counting from delay cell 211). In other words, the weighting encoder 290 is input by the latch signals 271 to 280, and outputs the encoded signals Q1 to Q1024. A specific example of the weighting is described later on.

The binary conversion encoder 300 converts the encoded signals Q1 to Q1024 into binary, and outputs the 10 bit analog-digital conversion output signal 206. The binary conversion encoder 300 in other words is input by the encoded signals Q1 to Q1024 and outputs an analog-digital conversion output signal 206.

Figure 2:
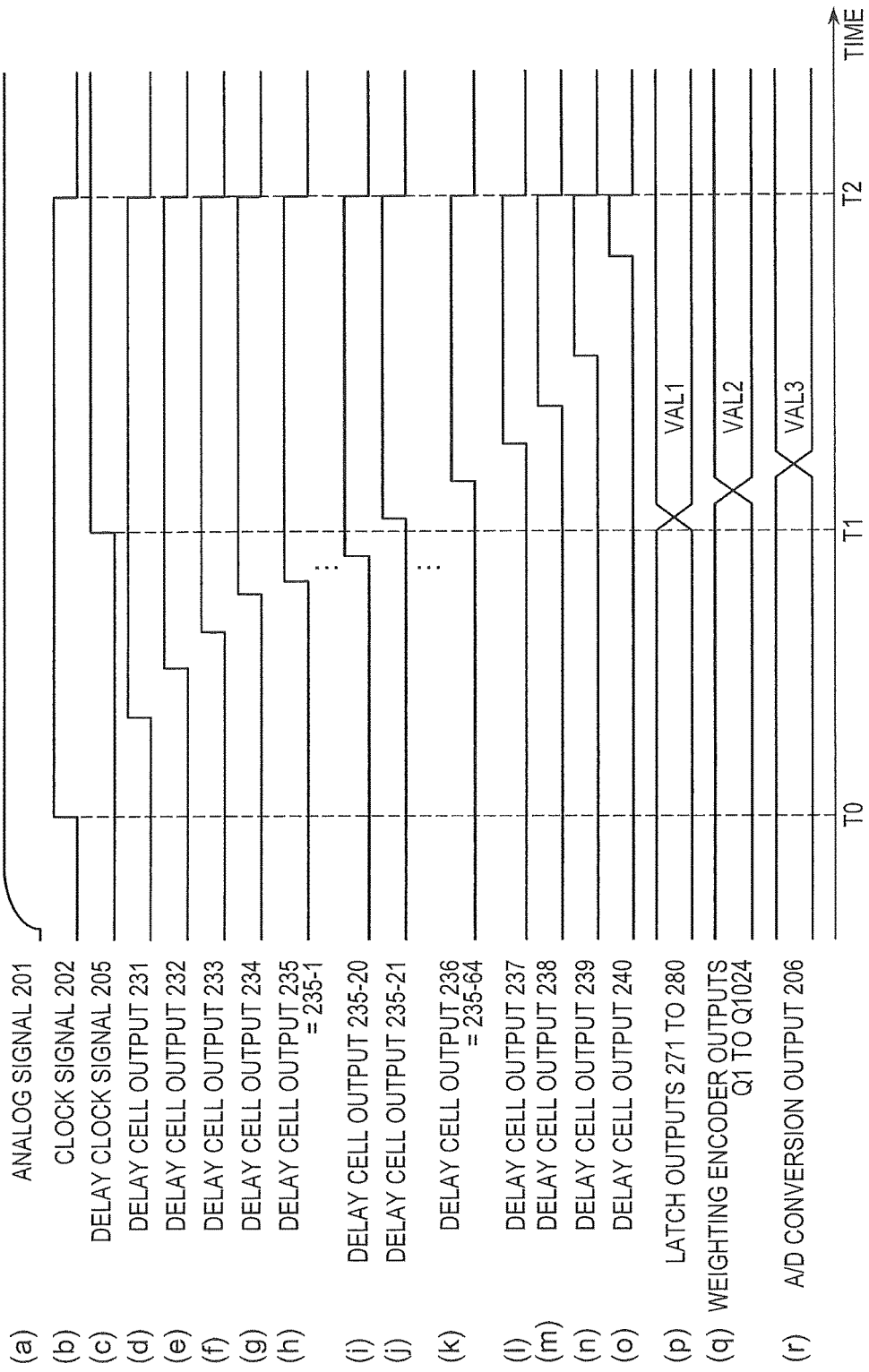
FIG. 2 is a timing chart showing an example of the operation of the analog-digital converter of the first embodiment.

The operation of the semiconductor device including an analog-digital converter of the present embodiment is described next. FIG. 2 is a timing chart showing an example of the operation of the analog-digital converter 200 of the present embodiment. Here, (a) denotes the analog input signal 201, (b) denotes the clock signal 202, (c) denotes the delay clock signal 205, (d) denotes the delay cell output signal 231, (e) denotes the delay cell output signal 232, (f) denotes the delay cell output signal 233, (g) denotes the delay cell output signal 234, (h) denotes the delay cell output signal 235 (=235-1), (i) denotes the delay cell output signal 235-20, (j) denotes the delay cell output signal 235-21, (k) denotes the delay cell output signal 236 (=235-64), (l) denotes the delay cell output signal 237, (m) denotes the delay cell output signal 238, (n) denotes the delay cell output signal 239, (o) denotes the delay cell output signal 240, (p) denotes the latch signals 271 to 280, (q) denotes the weighting encoder output (encoded signals Q1 to Q1024), (r) denotes the analog-digital conversion output signal 206.

External circuits not shown in FIG. 1 input the analog input signal 201 into the analog-digital converter 200 (see (a)). A control circuit not shown in FIG. 1 sets the clock signal 202 from low level to high level (see (b)) in the analog input signal 201 settling time T0. The clock signal 202 in this way propagates the delay cells 211 to 220. Consequently, the delay cells 211 to 220 outputs the delay cell output signals 231 to 240 so that the clocks signal 202 is delayed according to the respective delay quantities (see (d) to (o)).

The delay circuit 225 outputs the delay clock signal 205 so that the clock signal 202 is delayed just a specified time (ΔT=T1−T0) (See (b)). The flip-flops 251 to 260 provided equidistantly from the delay circuit 225 latch the delay cell output signals 231 to 240 at the (pulse) rise time T1 of the delay clock signal 205, and output these signals as the latch signals 271 to 280 (see (p)).

The latch signal 271 is input to the weighting encoder 290 as q256. In other words, the latch signal 271 is handled in 256 bit weights corresponding to 256 bit portions of data. The latch signal 272 is input to the weighting encoder 290 in the same way as the q384. In other words, the latch signal 272 is handled in 128 bit weights corresponding to a 128 bit portion of data. The latch signal 273 is input to the weighting encoder 290 as q448. The latch signal 273 is in other words, handled in 64 bit weights corresponding to a 64 bit portion of data. The latch signal 274 is input to the weighting encoder 290 as q480. The latch signal 274 is in other words handled in 32 bit weights corresponding to a 32 bit portion of data. The latch signals 275 to 276 (latch signals for 64 units) are respectively input to the weighting encoder 290 as q480 to q544. In other words, the latch signals 275 t0 276 (latch signals for 64 units) are handled in 1 bit weights corresponding to a 1 bit portion of data. The latch signal 277 is input to the weighting encoder 290 as q576. The latch signal 277 is in other words handled in 32 bit weights corresponding to a 32 bit portion of data. The latch signal 278 is input to the weighting encoder 290 as q640. The latch signal 278 is in other words handled in 64 bit weights corresponding to a 64 bit portion of data. The latch signal 279 is input to the weighting encoder 290 as q768. The latch signal 279 is in other words handled in 128 bit weights corresponding to a 128 bit portion of data. The latch signal 280 is input to the weighting encoder 290 as q1024. In other words, the latch signal 280 is handled in 256 bit weights corresponding to a 256 bit portion of data.

In the example in FIG. 2, the latch signals 271 to 280 (72 bit signal serving as the input to the weighting encoder 290) are VAL1 serving as the bus notation (see (p)) and become the following signals. Here, the case where the analog-digital conversion output signal 206 is "501 (decimal notation)" is described as an example.
(q256, q384, q448, q480, q481, . . . , q501, q502, . . . , q544, q576, q640, q768, q1024)=(11111 . . . 10 . . . 0000)

The weighting encoder 290 encodes the latch signals 271 to 280 by weighting corresponding to the delay cells 211 to 220, and outputs them as the encoded signals Q1 to Q1024 (see (q)).

In the example in FIG. 2, the encoded signals Q1 to Q1024 (1024 bit signals serving as the output from the weighting encoder 290) resulting from the weighted encoding of the latch signals 271 to 280 are represented as bus notation for VAL2 (see (q)) and are output as shown next.
(Q1, Q2, . . . , Q501, Q502, . . . , Q1023, Q1024)=(11 . . . 10 . . . 00)

The binary conversion encoder 300 converts the encoded signals Q1 to Q1024 into binary, and outputs the 10 bit analog-digital conversion output signal 206 (see (r)).

In the example in FIG. 2, the analog-digital conversion output signal 206 (10 bit signal output from the binary conversion encoder 300) resulting from binary conversion of the encoded signals Q1 to Q1024 and having the bus notation (tag) of VAL3 (see (r)) is output as follows.
Analog-digital conversion output signal 206= (0111110101) (=501 (decimal notation))

Next, at time T2, a control circuit not shown in FIG. 1, transitions the clock signal 202 from high level to low level. The delay cells 211 to 220 are all consequently reset and the delay cell output signals 231 to 240 are set to low level.

When all of the delay cells 211 to 220 are reset, the analog input signal 201 is changed and input. The operation from T0 to T2 is then repeated.

The semiconductor device including the analog-digital converter of the present embodiment operates as related in the above description.

Figure 3:
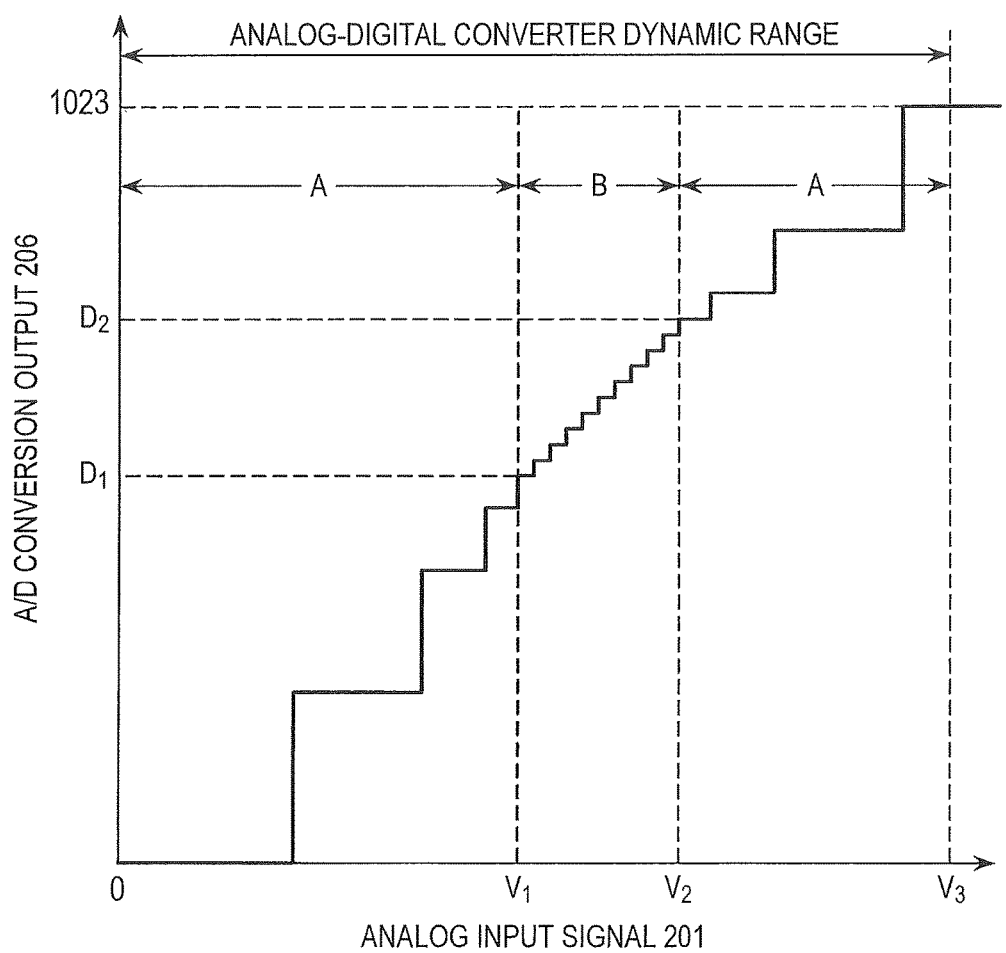
FIG. 3 is a graph showing conversion characteristics for converting an analog input signal to an analog-digital conversion output signal when utilizing an analog-digital converter of the first embodiment.

FIG. 3 is a graph showing conversion characteristics for converting an analog input signal 201 to an analog-digital conversion output signal 206 when utilizing an analog-digital converter 200 of the present embodiment. The horizontal axis shows the analog input signal 201 (voltage) and the vertical axis shows the analog-digital conversion output signal 206 (bit code). The dynamic range of the analog-digital converter 200 is 0 to $V_3$.

In this analog-digital converter 200, the conversion characteristics for converting the analog input signal 201 to the analog-digital conversion output signal 206 (digital signal) become broad when the range of the analog input signal 201 is A (0 to $V_1$, $V_2$ to $V_3$). On the other hand when the analog input signal 201 is in a range B ($V_1$ to $V_2$), the conversion characteristics of this analog-digital converter 200 become fine. In other words, this analog-digital converter 200 is an analog-digital converter capable of changing when a high accuracy is required within a range B and high accuracy is not required within a range A. Restated in other words, this analog-digital converter 200 is an analog-digital converter when the objective usage is analog-digital conversion in a range B, and analog-digital conversion in range A is not critical.

In other words, the accuracy of the delay quantity of delay cells in this analog-digital converter 200 can be set broader in a range A. Therefore, just a small number of delay cells having a large delay quantity can be utilized rather than using a large number of delay cells having a small delay quantity. The number of delay cells can in this way be reduced, and the circuit surface area required by the overall delay cell array can also be reduced. More specifically, in the case of an analog-digital converter 200 of this embodiment having 10 bit accuracy, the number of delay cells can be reduced from 1024 to 72. Along with a decrease in delay cells, the number of flip-flops can also be reduced and the circuit surface area can be reduced on the overall latch array. More specifically, in the case of an analog-digital converter 200 of this embodiment having 10 bit accuracy, the number of flip-flops can be reduced from 1024 to 72.

FIG. 4 is a truth table for the weighting encoder 290 input (latch signals 271 to 280), the binary conversion encoder 300 input (encoded signals Q1 to Q1024), and the analog-digital conversion output signal 206 of the present embodiment. However, qA indicates the signals for q482 to q543. Here, qX indicates the 0 or the 1 of this signal. The QB indicates the signals for Q482 to Q543. The QX indicates the 0 or the 1 for this signal. The X indicates that the analog-digital conversion output signal 206 is a code for any of 482 to 543.

Specific examples of qA, QB, qX, QX, and X are shown next.

When X=501, the inputs for the weighting encoder 290 at that time are qA: q482 to q501 is qX: "1", and qA: q502 to Q543 is qX: "0". The inputs for the binary conversion encoder 300 are QB: Q482 to Q501 are QX: "1", and QB: Q502 to Q543 are QX: "0".

Restated in other words, when the analog-digital conversion output signal 206, the X=501 is as follows.

(256, . . . , q481, . . . , q501, q502, . . . , q544, . . . , q1024)=(1 . . . 1 . . . 10 . . . 0 . . . 0): 72 bits
(Q1, . . . , Q481, . . . , Q501, Q502, . . . , Q544, . . . , Q1024)=(1 . . . 1 . . . 10 . . . 0 . . . 0): 1024 bits The analog-digital conversion output signal 206= (0111110101): 10 bits The analog-digital conversion output signal 206 is output in 1 code increments in a range from 481 to 544. In other ranges on the other hand, the analog-digital conversion output signal 206 is output at 2 or more code increments (in this example a maximum of 256 code increments) which is a broad output. The total number of analog-digital conversion codes that is output can therefore be reduced to an extremely small number. Therefore, by generating a circuit that logically combines the weighting encoder 290 and binary conversion encoder 300, the circuit surface area can be greatly reduced.

An output with high bit accuracy is now possible at this time in the range from 481 to 544. However in other ranges the bit accuracy is a relatively low output. By setting the bit accuracy high within the desired range, and setting the bit accuracy relatively low in all other ranges in this embodiment, the bit accuracy can be gradually raised in the desired range and the overall circuit surface area can be greatly reduced. Restated in other words, the dynamic range must be attained over a broad area but this approach is particularly effective when high-accuracy analog-digital conversion is required over a specific range.

In the present embodiment, the range with high bit accuracy output (example: output range at one code increment) is not limited to just a location in the vicinity of the center of the dynamic range as shown in the above example. As stated later on, the range with a high bit accuracy output may also for example be a location deviating from the center of the dynamic range. Alternatively, the range with a high bit accuracy output may be a location in the vicinity of the edge of the dynamic range, and may be plural location at random within the dynamic range. Further, the bit accuracy in the present embodiment is not limited to the case where the bit accuracy gradually is reduced towards both ends from the location in the vicinity of the center of the above described example of a dynamic range. The bit accuracy may for example be two types such as high and low, and may be three types such as high and medium and low, and need not be a two-fold increment.

In the present embodiment, combining the effect from reducing the circuit surface area of the delay cells and the flip-flops with the effect from reducing the circuit surface area of the weighting encoders and binary conversion encoders can reduce the circuit surface area 90 percent compared to the related art technology that utilizes only unit delay cells. Restated in other words, compared to the related art, the present invention can reduce the circuit surface area to one-tenth. That is, high accuracy analog-digital conversion can be performed on circuits on a small scale.

In the present embodiment, along with reducing the circuit surface area of the delay cells and the flip-flops and reducing the circuit surface area of the weighting encoders and binary conversion encoders; the number of elements within a circuit can also be reduced. The power consumption in the circuit can be reduced in this way. Moreover, along with reducing the number of elements, the wiring layout becomes simpler so that circuit design can easily be performed.

Second Embodiment

The semiconductor device including the analog-digital converter of the present embodiment is described next. The present embodiment differs from a first embodiment in the point that the initial stage (first stage) of the delay cell 411 is a variable delay quantity. The following description mainly covers the differing points.

Figure 5:
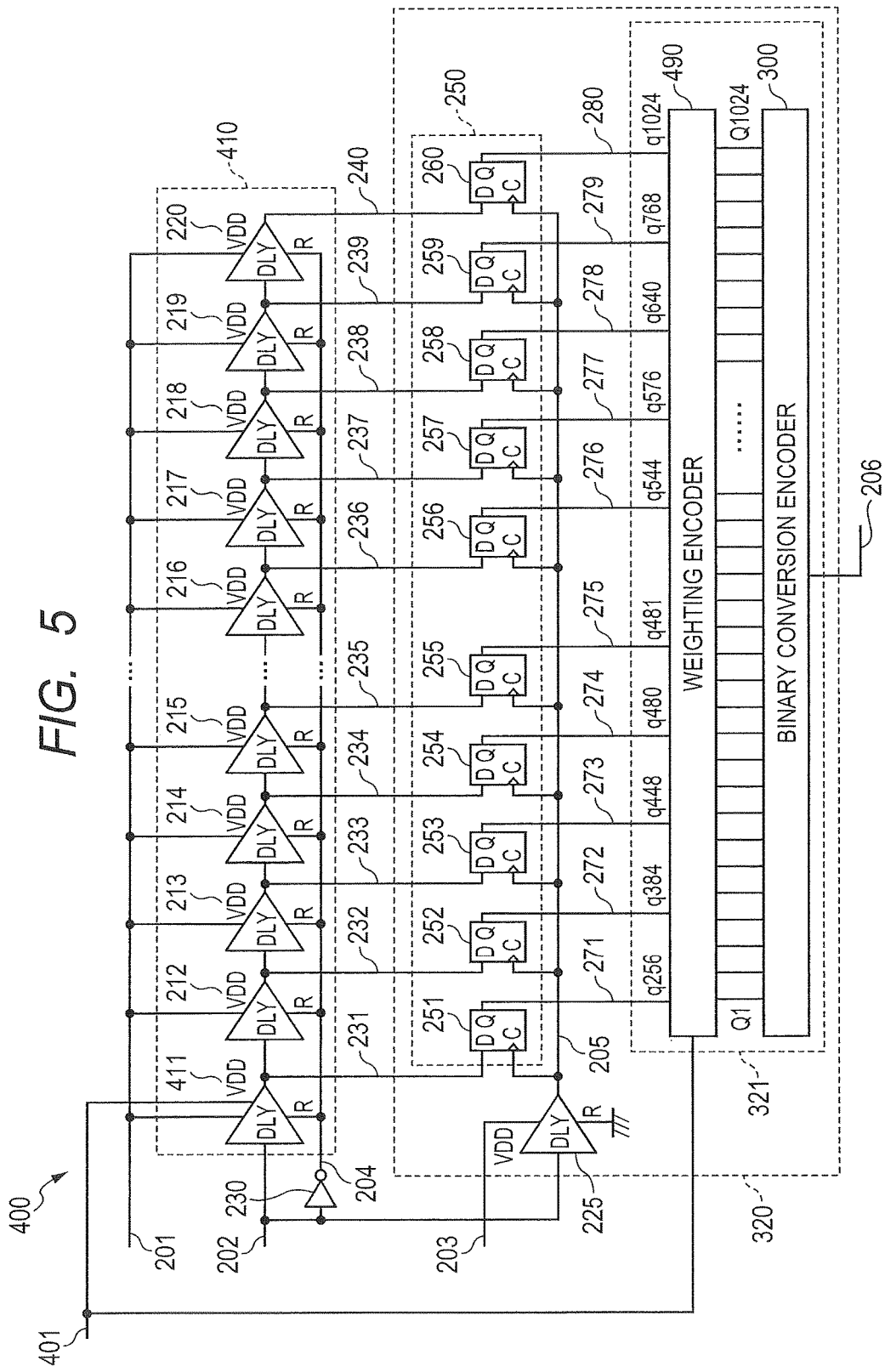
FIG. 5 is a block diagram showing an example of the structure of the analog-digital converter of a second embodiment.

The structure of the semiconductor device including the analog-digital converter of the present embodiment is described next. FIG. 5 is a block diagram showing a structural example of the analog-digital converter 400 of a second embodiment. In this analog-digital converter 400, items identical to the analog-digital converter 200 of the first embodiment are assigned the same numbers and their description is omitted. The analog-digital converter 400 of the present embodiment includes a delay cell array 410 and an encoder 320.

A delay cell array 410 includes a serially-coupled delay cell 411, and the serially-coupled delay cells 212 to 220. The delay cell 411 is the initial stage (first stage) delay cell in the delay cell array 410. The delay cell 411 is input by an analog input signal 201, a clock signal 202, an inverted clock signal 204, and a delay quantity control signal 401 (hereafter, also labeled as DSEL 401), and the delay cell 411 outputs a delay cell output signal 231. The delay cell 411 is capable of changing that delay quantity by way of the DSEL 401 value. Restated in other words, the delay quantity of the delay cell 411 can be changed by DSEL 401 value. The DSEL 401 can for example be input from an external control circuit. A variable resistor element inserted between the Pch transistor and the power supply voltage may be for example utilized as the delay cell 411 in the inverter circuit. By utilizing the DSEL 401 to adjust the resistance value of the variable resistor element, the delay time can be adjusted by varying the through-rate of the inverter circuit.

The encoder 320 includes a latch array 250 and a latch signal encoder 321. The latch signal encoder 321 contains a weighting encoder 490, and a binary conversion encoder 300. The weighting encoder 490 encodes the latch signals 271, ..., 280 for each stage of the flip-flops 251, ..., 260 of the latch array 250 by weighting that corresponds to the number of stages of the delay cells, 211, ..., 220, and outputs the encoded signals Q1 to Q1024. The DSEL 401 can however change the delay quantity of the clock signal 202 for the delay cell 411. If the delay quantity of the delay cell 411 has been changed by the DSEL 401, then the weighting for the encoding of the latch signals 271, ..., 280 described later on must also be changed. Therefore in this case, the weighting encoder 490 changes the weighting based on the DSEL 401. The latch signals 271, ..., 280 for the each stage of the flip-flops 251, ..., 260 for the latch array 250 are then encoded by the changed weighting that corresponds to the number of stages of the delay cells 211, ..., 220, and are output as the encoded signals Q1 to Q1024. That is, the weighting encoder 490 is input by the latch signals 271 to 280 and the DSEL 401 and outputs the encoded signals Q1 to Q1024.

The operation of the semiconductor device including the analog-digital converter of the present embodiment is described next. FIG. 6 is a timing chart showing an example of the operation of the analog-digital converter 400 of the present embodiment. In the figure, (a) is the clock signal 202; (b) is the delay cell output signal 231 for the case where the delay quantity of the delay cell 411 is relatively small; (c) is the delay cell output signal 231 for the case where the delay quantity of the delay cell 411 is relatively medium; and (d) is the delay cell output signal 231 for the case where the delay quantity of the delay cell 411 is relatively large.

In the present embodiment, the td1, td2, td3 of the respective delay quantities of the delay cell 411 can be changed by DSEL 401 as shown in FIG. 6 when the analog input signal 201 is fixed at the specified voltage (V0). In this case, the weighting encoder 490 outputs the encoded signals Q1 to Q1024 added with an offset according to the delay quantity of the DSEL 401. When the delay quantity of the delay cell 411 is td2 for example, then this delay quantity is set as a standard delay quantity. In this case, the offset is set as a minus offset when reducing the delay quantity of the delay cell 411 shown in DSEL 401 to td1. On the other hand, the offset is set as a plus offset when increasing the delay quantity to td3.

More specifically, when the delay quantity of the delay cell 411 is td2, the voltage V0 for the analog input signal 201 that the clock signal 202 is propagating among the delay cells 215-1 to 215-64 at time T1 is assumed to be in a range from 1.4V ($V_1$) to 1.6V ($V_2$). When the delay quantity of the delay cell 411 is reduced to td1 at this time, the clock signal 202 at time T1 propagates past the delay cells 215-1 to 215-64 at the same voltage range (1.4V to 1.6V) for the voltage V0 of analog input signal 201. Restated in other words, reducing the delay quantity of delay cell 411 to td1 causes the voltage V0 of the analog input signal 201 at which the clock signal 202 at time T1 is propagating among the delay cell 215-1 to 215-64 to become for example in the range from 1.3V ($V_{11}$) to 1.5 V ($V_{12}$) (drops 0.1V). That is, the analog input voltage range detected at the analog-digital converter 400 shifts overall to the low-voltage side. In the above described example, the analog input voltage range shifts by a 0.1V portion to the low-voltage side. Therefore, the weighting encoder 490 generates the encoded signals Q1 to Q1024 by adding processing to reduce the code quantity equivalent to the voltage shifted to the low-voltage side based on the DSEL 401, for the latch signals 271 to 280 corresponding to the drop in the analog input voltage range. In the above described example, the weighting encoder 490 applies processing to reduce the 32 codes serving as the code quantity equivalent to 0.1V for the latch signals 271 to 280 based on the DSEL 401, and generates the encoded signals Q1 to Q1024.

In the same way, when the delay quantity of the delay cell 411 is increased to td3, at the same voltage range (1.4V to 1.6V) for voltage V0 of analog input signal 201, the clock signal 202 only propagates before the delay cells 215-1 to 215-64 at time T1. Restated in other words, increasing the delay quantity of delay cell 411 to td3 causes the voltage V0 of analog input signal 201 at which the clock signal 202 at time T1 is propagating between the delay cells 215-1 to 215-64 for example to be in a range from 1.5V ($V_{21}$) to 1.7V ($V_{22}$) (rises 0.1V). Namely, the analog input voltage range detected by the analog-digital converter 400 is shifted overall to the high-voltage side. In the above described example, the analog input voltage range shifts by a 0.1V portion to the high-voltage side. The weighting encoder 490 therefore generates the encoded signals Q1 to Q1024 by adding processing to add a code quantity equivalent to the voltage shifted to the high-voltage side based on the DSEL 401, for the latch signals 271 to 280 corresponding to the rise in the analog input voltage range. In the above described example, the weighting encoder 490 applies processing to add the 32 codes serving as the code quantity equivalent to 0.1V for the latch signals 271 to 280 based on the DSEL 401, and generates the encoded signals Q1 to Q1024.

Based on the above description, the following can be related regarding the analog-digital converter 400 of the present embodiment. When the delay quantity of the delay cell 411 is set to td2, the input range with high bit accuracy for analog-digital conversion is assumed as: $V_{m2}-\Delta V_{m2}$ to $V_{m2}+\Delta V_{m2}$. In other words, a range that is identical to the delay cells 215-1 to 215-64 being switched when $V_{m2}-\Delta V_{m2}$ to $V_{m2}+\Delta V_{m2}$ is input as the analog input signal 201. Restated in other words, inputting $V_{m2}-\Delta V_{m2}$ to $V_{m2}+\Delta V_{m2}$ as the analog input signal 201, conveys the clock signal 202 to the delay cells 215-1 to 215-64.

When the delay quantity of the delay cell 411 is converted to td1, only that portion ($\Delta t=td2-td1$) of the delay quantity becomes small so that the propagation of the clock signal 202 becomes faster for just that portion. Consequently, the clock signal 202 propagates prior to the delay cells 216 (215-64) at the same input range of $V_{m2}-V_{m2}$ to $V_{m2}+\Delta V_{m2}$. For that reason, the input range with high bit accuracy for analog-digital conversion is therefore a voltage range where the propagation of the clock signal 202 has a greater delay than the $V_{m2}-\Delta V_{m2}$ to $V_{m2}+\Delta V_{m2}$. Restated in other words, the input range where the bit accuracy for analog-digital conversion is high can be changed to a low voltage range. When the delay quantity of the delay cell 411 is set to td1, the voltage range for the analog input signal 201 can be set to $V_{m1}-\Delta V_{m1}$ to $V_{m1}+\Delta V_{m1}$ (Here $V_{m1}<V_{m2}$).

On the other hand, when the delay quantity of delay cell 411 is changed to td3, only that portion ($\Delta t=td3-td2$) of the delay quantity becomes large so that the propagation of the clock signal 202 is delayed for just that portion. Consequently, the clock signal 202 only propagates just prior to the delay cells 216 (215-64) in the same input range $V_{m2}-\Delta V_{m2}$ to $V_{m2}+\Delta V_{m2}$. The input range with high bit accuracy for analog-digital conversion is therefore the voltage range where the propagation of the clock signal 202 becomes faster than the $V_{m2}-\Delta V_{m2}$ to $V_{m2}+\Delta V_{m2}$. Restated in other words, the input range with a high bit accuracy for analog-digital conversion can be changed to the high voltage range. When the delay quantity of delay cell 411 is set to td3, the voltage range of the analog input signal 201 can be set to $V_{m3}-\Delta V_{m3}$ to $V_{m3}+\Delta V_{m3}$ (Here $V_{m3}>V_{m2}$).

In FIG. 3 for example, the delay cell 211 is assumed as the delay quantity td2 of the delay cell 411. In this case, $V_1=V_{m2}-\Delta V_{m2}$, $V_2=V_{m2}+\Delta V_{m2}$, and the voltage range (B) of the analog input signal 201 having a high bit accuracy for analog-digital conversion is V1 to V2.

Figure 7A:
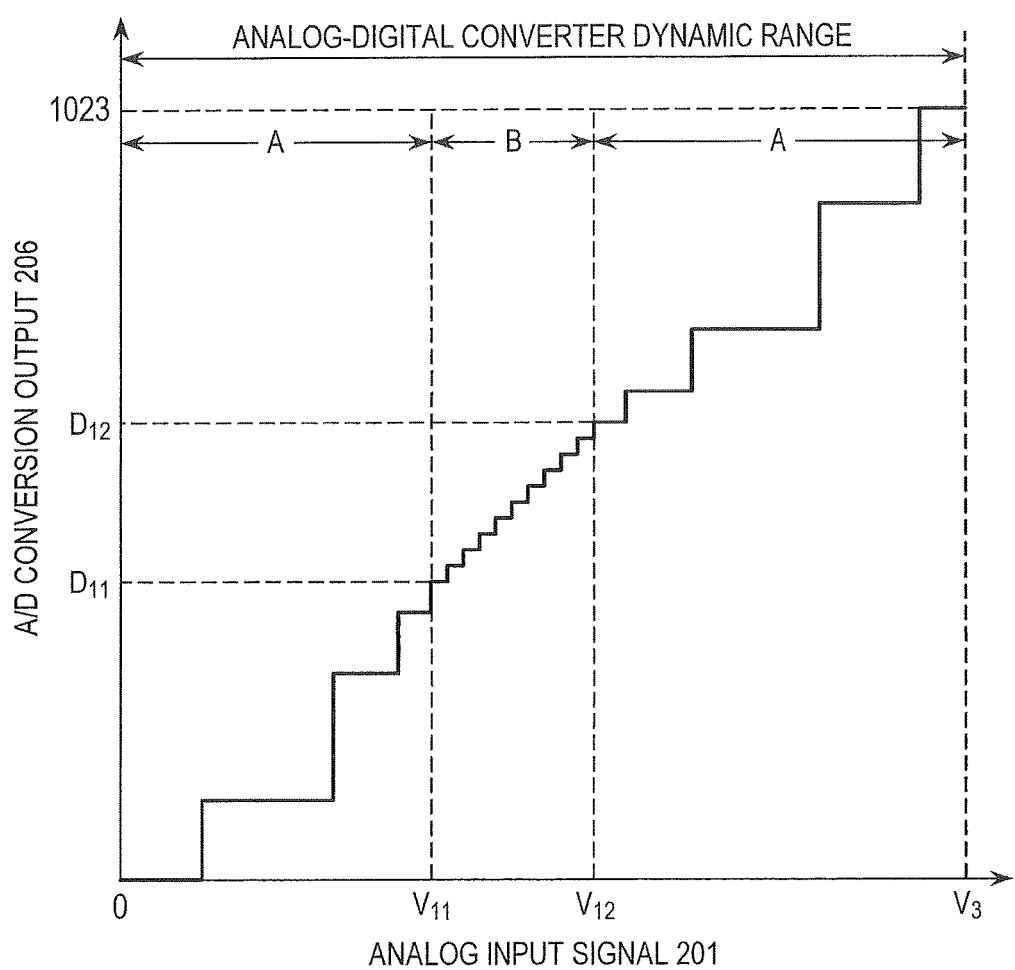
FIG. 7A is a graph showing the conversion characteristics for converting an analog input signal to an analog-digital conversion output signal when the delay quantity of the delay cell is decreased by using the analog-digital converter of the second embodiment.

FIG. 7A is a graph showing the conversion characteristics for converting the analog input signal 201 to an analog-digital conversion output signal 206 when the delay quantity of the delay cell 411 is set to td1 by utilizing the analog-digital converter 400 of the present embodiment. The horizontal axis shows the analog input signal 201 and the vertical axis shows the analog-digital conversion output signal 206. The dynamic range of the analog-digital converter 400 is 0 to $V_3$.

In this analog-digital converter 400, when the range of the analog input signal 201 is A (0 to $V_{11}$, $V_{12}$ to $V_3$), the conversion characteristics for changing the analog input signal 201 to the analog-digital conversion output signal 206 (digital signal) become broad. On the other hand, when the range of the analog input signal 201 is B ($V_{11}$ to $V_{12}$), the conversion characteristics become finer. In other words, the analog-digital converter 400 is an analog-digital converter applicable when a high accuracy is required within the range B and a high accuracy is not required within a range A. Restated in other words, the analog-digital converter 400 is an analog-digital converter applicable when the objective of usage is analog-digital conversion within the range B and analog-digital conversion within the range A is not critical. In this case, $V_{11}=V_{m1}-\Delta V_{m1}$, $V_{12}=V_{m1}+\Delta V_{m1}$, and the voltage range (B) of the analog input signal 201 with high bit accuracy for analog-digital conversion is $V_{11}$ to $V_{12}$. This voltage range is shifted more to the low-voltage side than the voltage range ($V_1$ to $V_2$) in FIG. 3.

Figure 7B:
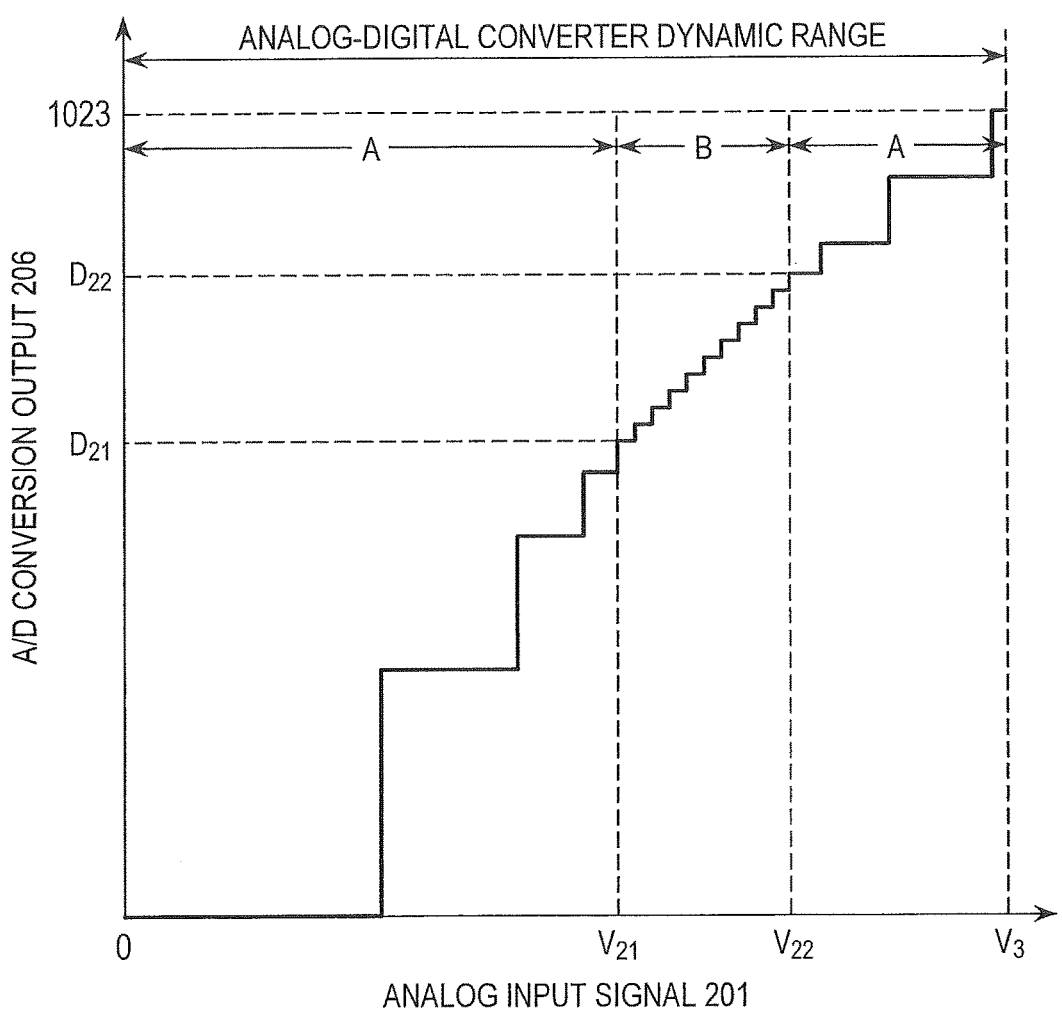
FIG. 7B is a graph showing the conversion characteristics for converting an analog input signal to an analog-digital conversion output signal when the delay quantity of the delay cell is increased by using the analog-digital converter of the second embodiment.

FIG. 7B on the other hand, is a graph showing the conversion characteristics for converting the analog input signal 201 to an analog-digital conversion output signal 206 when the delay quantity of the delay cell 411 is set to td3 by utilizing the analog-digital converter 400 of the present embodiment. The horizontal axis shows the analog input signal 201, and the vertical axis shows the analog-digital conversion output signal 206. The dynamic range of the analog-digital converter 400 is 0 to $V_3$.

In this analog-digital converter 400, when the range of the analog input signal 201 is A (0 to $V_{21}$, $V_{22}$ to $V_3$), the conversion characteristics for changing the analog input signal 201 to the analog-digital conversion output signal 206 (digital signal) become broad. On the other hand, when the range of the analog input signal 201 is B ($V_{21}$ to $V_{22}$), the conversion characteristics become finer. Namely, this analog-digital converter 400 is an analog-digital converter applicable when a high accuracy is required within the range B and a high accuracy is not required within the range A. Restated in other words, the analog-digital converter 400 is an analog-digital converter applicable when the objective of usage is analog-digital conversion within the range B and analog-digital conversion is not critical in range A. In this case, $V_{21}=V_{m3}-\Delta V_{m3}$, $V_{22}=V_{m3}+\Delta V_{m3}$, and the voltage range (B) of the analog input signal 201 with high bit accuracy for analog-digital conversion is $V_{22}$ to $V_{21}$. This voltage range is shifted more to the high-voltage side than the voltage range ($V_1$ to $V_2$) in FIG. 3.

In the present embodiment, when the delay quantity of the delay cell 411 is reduced to td1, the voltage V0 of the analog input signal 201 propagating among the delay cells 215-1 to 215-64 capable of analog-digital conversion with high bit accuracy is relatively low. Accordingly, when the voltage range of the voltage V0 of the analog input signal 201 needed to be measured with high accuracy is relatively low, the delay quantity of the delay cell 411 is made smaller by way of DSEL 401. The voltage range of the delay cells 215-1 to 215-64 capable of analog-digital conversion with high bit accuracy can in this way be lowered.

However when the delay quantity of the delay cell 411 is increased to td3, the voltage V0 of the analog input signal 201 propagating among the delay cells 215-1 to 215-64 capable of analog-digital conversion with high bit accuracy becomes relatively high. Accordingly, when the voltage range of the voltage V0 for the analog input signal 201 needed to be measured with a high accuracy is relatively high, the delay quantity of the delay cell 411 is set to a large quantity by way of the DSEL 401. The voltage range of the delay cells 215-1 to 215-64 capable of analog-digital conversion with high bit accuracy can in this way be set high.

The present embodiment is also capable of rendering the same effects as the first embodiment. Moreover, as described above, in the present embodiment, adding a delay quantity control signal (DSEL) 401 makes the bit accuracy for analog-digital conversion become high, and the input range of the analog input signal 201 can be freely changed. The analog-digital converter 400 can be therefore applied to analog input signal having different types of voltage ranges.

Third Embodiment

The semiconductor device including the analog-digital converter of the present embodiment is described next. The present embodiment differs from the first embodiment in the point that the output timing of the delay clock signal 205 serving as the clock input for the flip-flops 251 to 260 is variable. The following description hereafter mainly covers the differing point.

Figure 8:
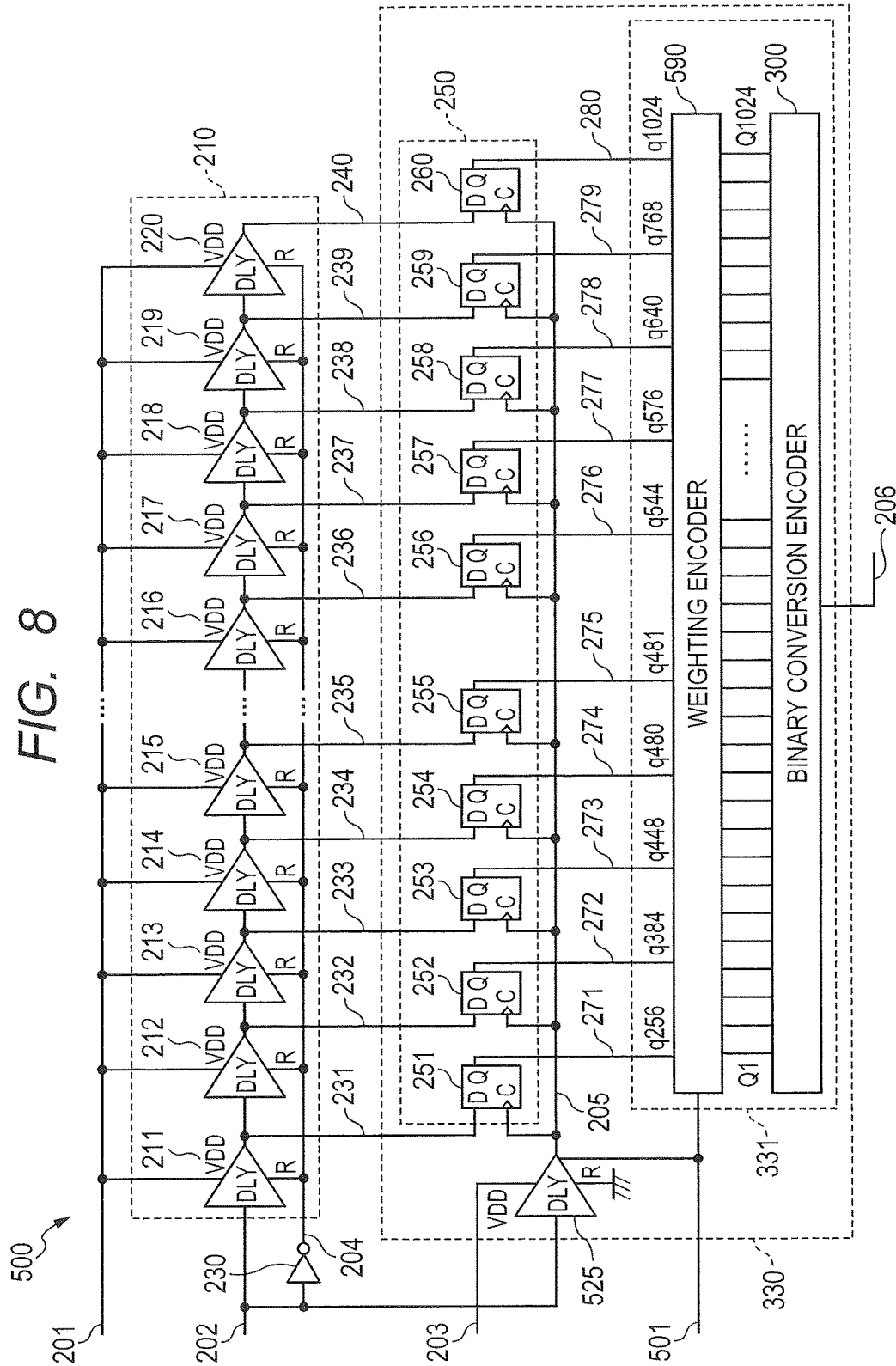
FIG. 8 is a block diagram showing an example of the structure of the analog-digital converter of a third embodiment.

The structure of the semiconductor device including the analog-digital converter of the present embodiment is described next. FIG. 8 is a block diagram showing an example of the structure of the analog-digital converter 500 of the present embodiment. In this analog-digital converter 500, items identical to the analog-digital converter 200 of the first embodiment are assigned the same numbers and their description is omitted. The analog-digital converter 500 of the present embodiment includes a delay cell array 210 and an encoder 330.

The encoder 330 includes a latch array 250, a delay circuit 525, and a latch signal encoder 331. The delay circuit 525 delays the clock signal 202 and outputs this as a delay clock signal 205. The delay circuit 525 is supplied with the reference voltage 203 as a power supply voltage and a reference voltage circuit delay quantity control signal 501 (hereafter described as VSEL 501) as a control signal. The delay quantity of the clock signal 202 in the delay circuit 525 is variable by way of the VSEL 501. Namely, the delay circuit 525 utilizes the reference voltage 203 as a power supply, is input by the clock signal 202 and the VSEL 501, and outputs the delay clock signal 205. The delay circuit 525 is for example capable of utilizing a variable resistor element inserted between a Pch transistor and power supply voltage in an inverter circuit. The VSEL 501 is capable of adjusting the resistance value of this variable resistance element, adjusting the through-rate of the inverter circuit, and adjusting the delay time.

The latch signal encoder 331 includes a weighting encoder 590, and a binary conversion encoder 300. The weighting encoder 590 encodes the latch signals 271, . . . , 280 from each stage of the flip-flops 251, ..., 260 for the latch array 250 by weighting corresponding to the number of stages of the delay cells 211, ..., 220 and outputs the encoded signals Q1 to Q1024. However, when the delay quantity of the delay circuit 525 is changed by the VSEL 501, the weighting for encoding the latch signals 271, ..., 280 as described later on must also be changed. In that case, the weighting encoder 590 therefore changes the weighting based on the VSEL 501. The latch signals, 271, ..., 280 of the flip-flops 251, ..., 260 in each stage for the latch array 250 are then encoded by the changed weighting corresponding to the number of stages of delay cells 211, ..., 220 and the encoded latch signals are output as the encoded signals Q1 to Q1024. In other words, the weighting encoder 590 is input by the latch signals 271 to 280 and the VSEL 501, and outputs the encoded signals Q1 to Q1024.

Figure 9:
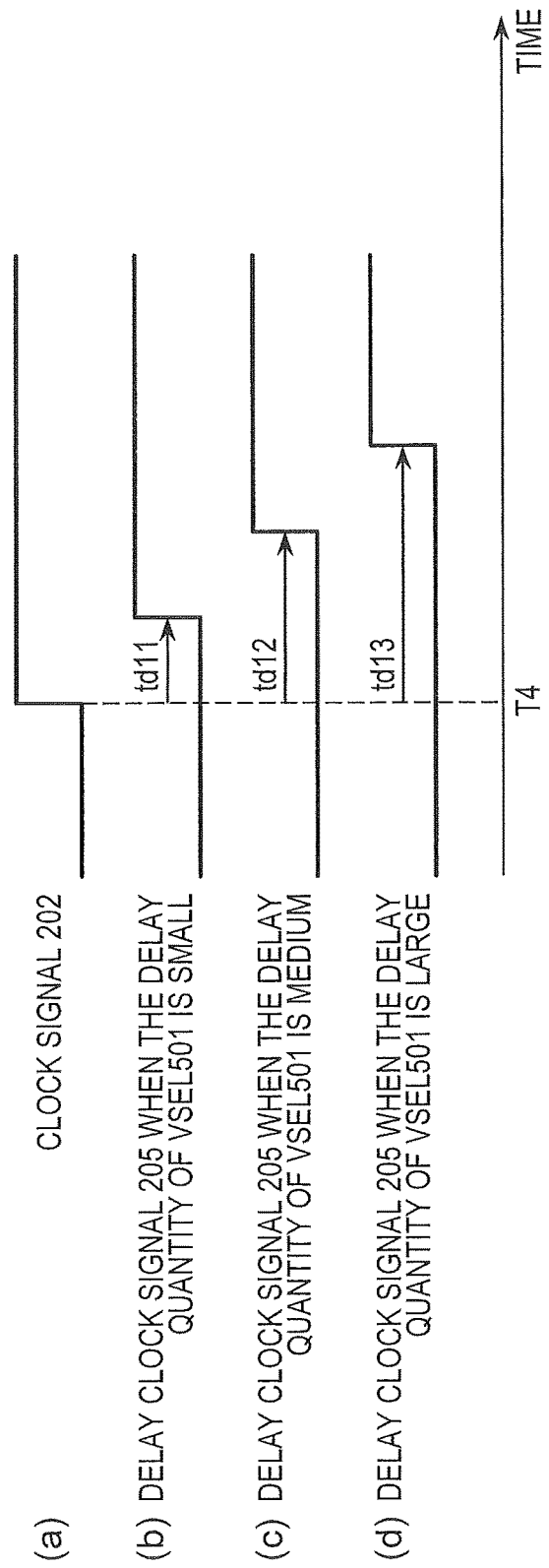
FIG. 9 is a timing chart showing an example of the operation of the analog-digital converter of the third embodiment.

The operation of the semiconductor device including the analog-digital converter of the present embodiment is described next. FIG. 9 is a timing chart showing an example of the operation of the analog-digital converter 500 of the present embodiment. Here, (a) denotes the clock signal 202, (b) denotes the delay clock signal 205 when the delay quantity of the delay circuit 525 is relatively small, (c) denotes the delay clock signal 205 when the delay quantity of the delay circuit 525 is relatively medium, and (d) denotes the delay clock signal 205 when the delay quantity of the delay circuit 525 is relatively large.

In the present embodiment, the reference voltage 203 is a fixed voltage, and the delay quantities of the delay circuit 525 can respectively be changed by the VSEL 501 to td11, td12, and td13 as shown in FIG. 9. In this case, the weighting encoder 590 outputs the encoded signals Q1 to Q1024 added with an offset according to the delay quantity of the VSEL 501. For example, a standard delay quantity is set when the delay quantity of the delay circuit 525 is td12. In this case, the offset is set to a plus offset when the delay quantity of the delay circuit 525 is shown in VSEL 501 is reduced to td11. However when the delay quantity is increased to td13 then the offset is set to a minus offset.

More specifically, when the delay quantity of the delay circuit 525 is td12, a delay clock signal 205 is assumed to be input to the flip-flops 251 to 260 at time T1. The voltage V0 of the analog input signal 201 that the clock signal 202 propagates among the delay cells 215-1 to 215-64 is assumed to be in a range from 1.4V to 1.6V. At that time, when the delay quantity of delay circuit 525 is reduced to td11, the delay clock signal 205 is input to the flip-flops 251 to 260 at time T1−ΔT1. The clock signal 202 therefore only propagates before the delay cells 215-1 to 215-64 at the time T1−ΔT1 in the same voltage range V0 (1.4V to 16V) for the analog input signal 201. Restated into other words, reducing the delay quantity of the delay circuit 525 to td11, causes the voltage V0 of the analog input signal 201 so that the clock signal 202 propagates among the delay cell 215-1 to 215-64 at time T1−ΔT1 to be within a range for example of 1.5V to 1.7V (rises 0.1V). Namely, the analog input voltage range detected by the analog-digital converter 500 is shifted overall to the high-voltage side. In the above described example, the analog input voltage range is shifted in 0.1 volt portions to the high-voltage side. Therefore, the weighting encoder 590 generates the encoded signals Q1 to Q1024 by adding processing to add a code quantity equivalent to the voltage shifted to the high-voltage side based on the VSEL 501, for the latch signals 271 to 280 corresponding to the rise in the analog input voltage range. In the above described example, the weighting encoder 590 applies processing to add the 32 codes serving as the code quantity equivalent to 0.1V for the latch signals 271 to 280 based on the VSEL 501, and generates the encoded signals Q1 to Q1024.

In the same way, increasing the delay quantity of delay circuit 525 to td13 inputs the delay clock signal 205 to the flip-flops 251 to 260 at a time T1+ΔT1. Consequently, the clock signal 202 propagates first to the delay cells 215-1 to 215-64 at the time T1+ΔT1 in the same voltage range (1.4V to 1.6V) of voltage V0 for analog input signal 201. Restated in other words, increasing the delay quantity of the delay circuit 525 to td13, cause the voltage V0 of clock input signal 201 so that the clock signal 202 at time T1+ΔT1 propagates among the delay cells 215-1 to 215-64 for example in a range from 1.3V to 1.5V (drops 0.1V). Namely, the analog input voltage range detected by the analog-digital converter 500 is shifted overall to the low-voltage side. In the above described example, the analog input voltage range is shifted in 0.1V portion to the low-voltage side. The weighting encoder 590 therefore generates the encoded signals Q1 to Q1024 by applying processing to reduce the code quantity equivalent to the voltage shifted to the low-voltage side based on the VSEL 501, for the latch signals 271 to 280 corresponding to the drop in the analog input voltage range. In the above described example, the weighting encoder 590 applies processing to reduce the 32 codes serving as the code quantity equivalent to 0.1V for the latch signals 271 to 280 based on the VSEL 501, and generates the encoded signals Q1 to Q1024.

Based on the above description, the following can be stated regarding the analog-digital converter 500 of the present embodiment. When the delay quantity of the delay circuit 525 is set to td12, the input range with high bit accuracy for analog-digital conversion is assumed as: $Vm_{12}-\Delta V_{12}$ to $V_{m12}+\Delta V_{m12}$. In other words, inputting the $Vm_{12}+\Delta V_{m12}$ to $V_{m12}+\Delta V_{m12}$ as the analog input signal 201 at the timing where the delay cells 215-1 to 215-64 switch renders a value equivalent to the rise of the delay clock signal 205 from low level to high level. Restated in other words, inputting $Vm_{12}-\Delta V_{12}$ to $V_{m12}+\Delta V_{12}$ as the analog input signal 201, conveys the clock signal 202 to the delay cells 215-1 to 215-64 at the rise timing of the delay clock signal 205.

When the delay quantity of the delay circuit 525 is changed to td11, only the portion (Δt1=td12−td11) of the delay quantity becomes small so that the rise timing of the delay clock signal 205 becomes faster by that same amount. Consequently, the delay cell output signals 231 to 240 are latched at a faster timing than the propagation time of the clock signal 202 to the delay cells 215-1 to 215-64. The input range with high bit accuracy for analog-digital conversion is therefore a voltage range such as where the clock signal 202 propagation becomes faster than $Vm_{12}-\Delta V_{m12}$ to $V_{m12}+\Delta V_{12}$. Related in other words, the input range where the bit accuracy for analog-digital conversion is high can be changed to a high-voltage range. The delay quantity of the delay circuit 525 is set to td11, the voltage range of the analog input signal 201 can be set to $V_{m11}-\Delta V_{m11}$ to $V_{m11}+\Delta V_{m11}$ (Here $V_{11}>V_{m12}$). This state corresponds broadly to FIG. 7B.

On the other hand, when the delay quantity of the delay circuit 525 is changed to td13, only that portion (Δt1=td13−td12) of the delay quantity becomes large so that the rise timing of the delay clock signal 205 is delayed for just that portion. Consequently, the delay cell output signals 231 to 240 are latched at a slower timing than the propagation time of the clock signal 202 to the delay cells 215-1 to 215-64. The input range with high bit accuracy of analog-digital conversion is therefore a voltage range where the propagation of the clock signal 202 is delayed more than $V_{m12}-\Delta V_{m12}$ to $V_{m12}+\Delta V_{m12}$. Restated in other words, the input range with high bit accuracy of analog-digital conversion can be changed to the low-voltage range. When the delay quantity of delay circuit 525 is set to td13, the voltage range of the analog input signal 201 can be set to $Vm_{13}-\Delta V_{m13}$ to $V_{m13}+\Delta V_{m13}$ (Here $V_{m13}<V_{m12}$). This state corresponds broadly to FIG. 7A.

In the present embodiment, when the delay quantity of the delay circuit 525 is reduced to td11, the voltage V0 of the analog input signal 201 propagating among the delay cells 215-1 to 215-64 capable of analog-digital conversion with high bit accuracy is set relatively high. Accordingly, when the voltage range of the voltage V0 for the analog input signal 201 must be measured with relatively high accuracy, the VSEL 501 reduces the delay quantity of the delay circuit 525. The voltage range of the delay cells 215-1 to 215-64 capable of analog-digital conversion with high bit accuracy can in this way be set high.

However, when the delay quantity of the delay circuit 525 is increased to td13, the voltage V0 of the analog input signal 201 propagating among the delay cells 215-1 to 215-64 capable of analog-digital conversion with high bit accuracy is relatively low. Therefore, when the voltage range of the voltage V0 of the analog input signal 201 needed to be measured with a high accuracy is relatively low, the VSEL 501 increases the delay quantity of the delay circuit 525. The voltage range of the delay cells 215-1 to 215-64 capable of analog-digital conversion with high bit accuracy can in this way be lowered.

The present embodiment is also capable of rendering the same effects as the first embodiment. Moreover, as described above, in the present embodiment, by adding a reference voltage circuit delay quantity control signal (VSEL) 501, the input range of the analog input signal 201 with high bit accuracy for analog-digital conversion can be freely changed. The analog-digital converter 500 can therefore be applied to analog input signals having different types of voltage ranges.

Fourth Embodiment

The semiconductor device including the analog-digital converter of the present embodiment is described next. The present embodiment differs from the first embodiment in the point that the output timing of the delay clock signal 205 serving as the clock input for the flip-flops 251 to 260 is variable by the method different from a third embodiment. The following description hereafter mainly covers that differing point.

Figure 10:
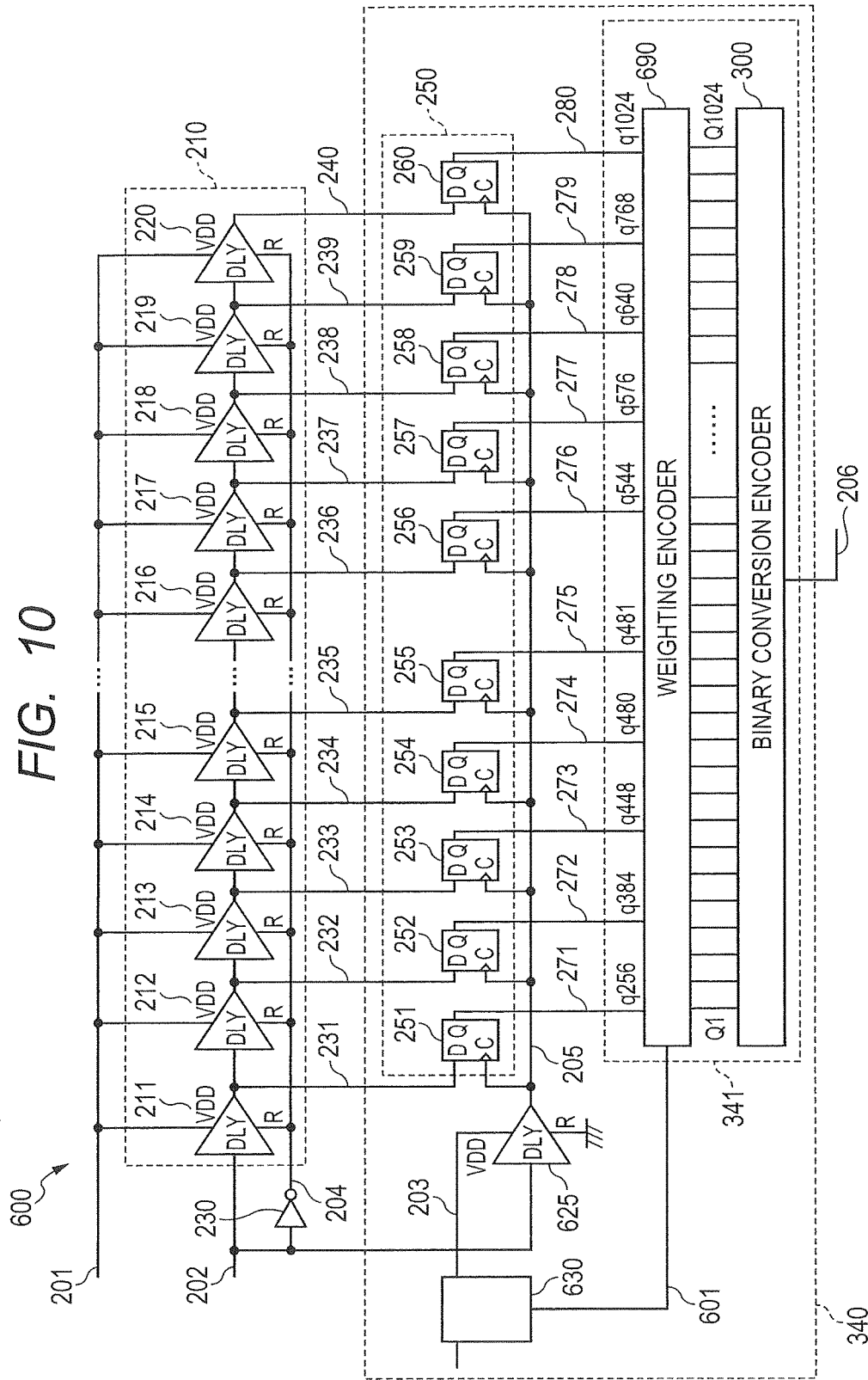
FIG. 10 is a block diagram showing an example of the structure of the analog-digital converter of a fourth embodiment.

The structure of the semiconductor device including the analog-digital converter of the present embodiment is described next. FIG. 10 is a block diagram showing an example of the structure of the analog-digital converter 600 of the present embodiment. In this analog-digital converter 600, items identical to the analog-digital converter 200 of the first embodiment are assigned the same numbers and their description is omitted. The analog-digital converter 600 of the present embodiment includes a delay cell array 210 and an encoder 340.

The encoder 340 includes a latch array 250, a delay circuit 625, a power supply voltage control circuit 630, and a latch signal encoder 341. The delay circuit 625 delays the clock signal 202 and outputs this as a delay clock signal 205. The delay circuit 625 is supplied with a reference voltage 203 as a power supply voltage. The reference voltage 203 is capable of changing the delay quantity of the clock signal 202 in the delay circuit 625. Namely, the delay circuit 625 utilizes a variable reference voltage 203 as the power supply, and is input by a clock signal 202, and outputs the delay clock signal 205.

The power supply voltage control circuit 630 outputs a reference voltage 203 as the power supply voltage for the delay circuit 625. The power supply voltage control circuit 630 controls the delay quantity of the delay circuit 625 by raising or lowering the reference voltage 203. Restated in other words, the power supply voltage control circuit 630 regulates the output timing of the delay clock signal 205 by increasing or decreasing the reference voltage 203. The power supply voltage control circuit 630 further outputs a reference voltage notification signal 601 (hereafter described as VA 601) that shows the value of the reference voltage 203.

The latch signal encoder 341 includes a weighting encoder 690, and a binary conversion encoder 300. The weighting encoder 690 encodes the latch signals 271, . . . , 280 of the flip-flop 251, . . . , 260 in each stage for the latch array 250 by weighting corresponding to the number of stages of the delay cells 211, . . . , 220 and outputs those encoded signals Q1 to Q1024. However, when the delay quantity of the delay circuit 625 is changed by the reference voltage 203, the weighting for encoding the latch signals 271, . . . , 280 as described later on must also be changed. Therefore, the weighting encoder 690 in this case changes the weighting based on the VA 601 output from the power supply voltage control circuit 630. The latch signals 271, . . . , 280 of the flip-flops 251, . . . , 260 in each stage for the latch array 250 are then encoded by the changed weighting corresponding to the number of stages of delay cells 211, . . . , 220 and are output as the encoded signals Q1 to Q1024. In other words, the weighting encoder 690 is input by the latch signals 271 to 280 and VA 601, and outputs the encoded signals Q1 to Q1024.

The semiconductor device including the analog-digital converter of the present embodiment is described next. In the analog-digital converter 600 of the present embodiment, the power supply voltage control circuit 630 is assumed capable of changing the reference voltage 203 for example to Vref1, Vref2, and Vref3 (Vref1>Vref2>Vref3). When the reference voltage 203 is Vref1, Vref2, and Vref3, the delay quantities of the delay circuit 625 are assumed as respectively changed to td21, td22, and td23.

The power supply voltage control circuit 630 outputs a VA 601 corresponding to the value of the reference voltage 203 that is output, to the weighting encoder 690. The weighting encoder 690 outputs the encoded signals Q1 to Q1024 added with an offset according to VA 601. If the VA 601 for example indicates a reference voltage 203=Vref1, the offset is set as the plus offset. If the VA 601 on the other hand indicates a reference voltage 203=Vref3, then the offset is set as minus offset.

More specifically, when the power supply voltage control circuit 630 sets the reference voltage 203 to Vref2, and the delay quantity of the delay circuit 625 is td22, the delay clock signal is assumed to be input at time T1 to the flip-flops 251 to 260. Also, the voltage V0 of the analog input signal 201 that the clock signal 202 propagates among the delay cells 215-1 to 215-64 is assumed to be in a range of 1.4V to 1.6V. When the power supply voltage control circuit 630 sets the reference voltage 203 to Vref1, the delay quantity of the delay circuit 625 is reduced to td21 (<td22). The delay clock signal 205 is in this way input to the flip-flops 251 to 260 at time T1−ΔT1. The clock signal 202 therefore only propagates before the delay cells 215-1 to 215-64 at time T1−ΔT1 in the same voltage range (1.4V to 1.6V) of the voltage V0 of the analog input signal 201. Restated into other words, when the delay quantity of delay circuit 625 is reduced to td21, the voltage V0 of the analog input signal 201 at which the clock signal 202 propagates among the delay cells 215-1 to 215-64 at time T1−ΔT1 is for example in a range of 1.5V to 1.7V (rise of 0.1V). In other words, the analog input voltage range detected by the analog-digital converter 600 is shifted overall to the high-voltage side. In the above described example, the analog input voltage range is shifted in 0.1 volt portions to the high-voltage side. The weighting encoder 690 therefore generates the encoded signals Q1 to Q1024 by applying processing to add a code quantity equivalent to the voltage shifted to the high-voltage side based on the VA 601 for the latch signals 271 to 280 corresponding to the rise in the analog input voltage range. In the above described example, the weighting encoder 690 applies processing to add the 32 codes serving as the code quantity equivalent to 0.1V for the latch signals 271 to 280 based on the VA 601, and generates the encoded signals Q1 to Q1024.

In the same way, the delay quantity of the delay circuit 625 is increased to td23 (>td22) when the power supply voltage control circuit 630 sets the reference voltage 203 to Vref3. The delay clock signal 205 is in this way input to the flip-flops 251 to 260 at time T1+ΔT1. The clock signal 202 therefore propagates first to the delay cells 215-1 to 215-64 at time T1+ΔT1, in the same voltage range (1.4V to 1.6V) as the voltage V0 of the analog input signal 201. Restated into other words, when the delay quantity of delay circuit 625 is increased to td23, the voltage V0 of the analog input signal 201 at which the clock signal 202 propagates among delay cells 215-1 to 215-64 at time T1+ΔT1 is for example in a range from 1.3V to 1.5V (drop of 0.1V). Namely, the analog input voltage range detected by the analog-digital converter 600 is shifted overall to the low-voltage side. In the above described example, the analog input voltage range is shifted in 0.1 volt portions to the low-voltage side. The weighting encoder 690 therefore generates the encoded signals Q1 to Q1024 by applying processing to reduce the code quantity equivalent to the voltage shifted to the low-voltage side based on the VA 601 for the latch signals 271 to 280 corresponding to the drop in the analog input voltage range. In the above described example, the weighting encoder 690 applies processing to reduce the 32 codes serving as the code quantity equivalent to 0.1V for the latch signals 271 to 280 based on the VA 601, and generates the encoded signals Q1 to Q1024.

Based on the above description, the following can be stated regarding the analog-digital converter 600 of the present embodiment. When the power supply voltage control circuit 630 sets the reference voltage 203 to Vref2, the input range with high bit accuracy for analog-digital conversion is assumed as: $Vm_{22}-\Delta V_{m22}$ to $V_{m22}+\Delta V_{m22}$. In other words, inputting the $Vm_{22}-\Delta V_{m22}$ to $V_{m22}+\Delta V_{m22}$ is input as the analog input signal 201 at the timing where the delay cells switch, renders a value equivalent to the rise of the delay clock signal 205 from low level to high level. Restated in other words, inputting $Vm_{22}-\Delta V_{m22}$ to $V_{m22}+\Delta V_{m22}$ as the analog input signal 201, conveys the clock signal 202 to the delay cells 215-1 to 215-64 at the rise timing of the delay clock signal 205.

When the power supply voltage control circuit 630 has set the reference voltage 203 to Vref1, the delay quantity in the delay circuit 625 is reduced to td21. The delay clock signal 205 in this way rises by just this portion (Δt2=td22−td21) from low level to high level at a fast timing. Consequently, the delay cell output signals 231 to 240 are latched at a timing that is faster than the propagation of the clock signal 202 to the delay cells 215-1 to 215-64. Therefore, the input range with high bit accuracy for analog-digital conversion is a voltage range such as where the clock propagation becomes faster than $Vm_{22}-\Delta V_{m22}$ to $V_{m22}+\Delta V_{m22}$. Restated in other words, the input range with high bit accuracy for analog-digital conversion can be changed to a high-voltage range. When the reference voltage 203 is set to Vref1, the voltage range of the analog input signal 201 can be set to $V_{m21}-\Delta V_{m21}$ to $V_{m21}+\Delta V_{m21}$ (Here $V_{m21}>V_{m22}$). This state corresponds broadly to FIG. 7B.

On the other hand, when the power supply voltage control circuit 630 has changed the reference voltage 203 to Vref3, the delay quantity in the delay circuit 625 is increased to td23. The delay clock signal 205 in this way rises by just this portion (Δt2=td23−td22) from low level to high level at a delayed timing. Consequently, the delay cell output signals 231 to 240 are latched at a timing that is slower than the propagation time of the clock signal 202 to the delay cells 215-1 to 215-64. The input range with high bit accuracy for analog-digital conversion is a voltage range such as where the clock propagation becomes slower than $Vm_{22}-\Delta V_{m22}$ to $V_{m22}+\Delta V_{m22}$. Restated in other words, the input range with high bit accuracy for analog-digital conversion can be changed to a low-voltage range. When the reference voltage 203 is set to Vref3, the voltage range of the analog input signal 201 can be set to $V_{m23}-\Delta V_{m23}$ to $V_{m23}+\Delta V_{m23}$ (Here $V_{m23}<V_{m22}$). This state corresponds broadly to FIG. 7A.

In the present embodiment, when the power supply voltage control circuit 630 sets the reference voltage 203 high such as to Vref1, and the delay quantity of the delay circuit 625 is reduced to td21, the voltage V0 of the analog input signal 201 propagating among the delay cells 215-1 to 215-64 capable of analog-digital conversion with high bit accuracy becomes relatively high. Therefore, when the voltage range of the voltage V0 of the analog input signal 201 that must be measured at high accuracy is relatively high, the VA 601 increases the reference voltage 203. The voltage range of the delay cells 215-1 to 215-64 capable of analog-digital conversion with high bit accuracy can in this way be increased.

However, when the power supply voltage control circuit 630 sets the reference voltage 203 low such as to Vref3, and the delay quantity of the delay circuit 625 is increased to td23, the voltage V0 of the analog input signal 201 propagating among the delay cells 215-1 to 215-64 capable of analog-digital conversion with high bit accuracy becomes relatively low. The VA 601 is therefore capable of lowering the reference voltage 203 when the voltage range of the voltage V0 of the analog input signal 201 that must be measured at high accuracy is relatively low. The voltage range of the delay cells 215-1 to 215-64 capable of analog-digital conversion with high bit accuracy can in this way be lowered.

The present embodiment is also capable of rendering the same effects as the first embodiment. Moreover, as described above, in the present embodiment, adding a reference voltage notification signal (VA) 601 serves to increase the bit accuracy for analog-digital conversion and the input range of the analog input signal 201 can be freely changed. The analog-digital converter 600 can therefore be applied to analog input signals having different types of voltage ranges.

Fifth Embodiment

The semiconductor device including the analog-digital converter of the present embodiment is described next. The present embodiment differs from the first through a fourth embodiments in the point that a digital control power supply device is applied as the analog-digital converter described in any of the first through the fourth embodiments. The following description hereafter mainly covers that differing point.

Figure 11:
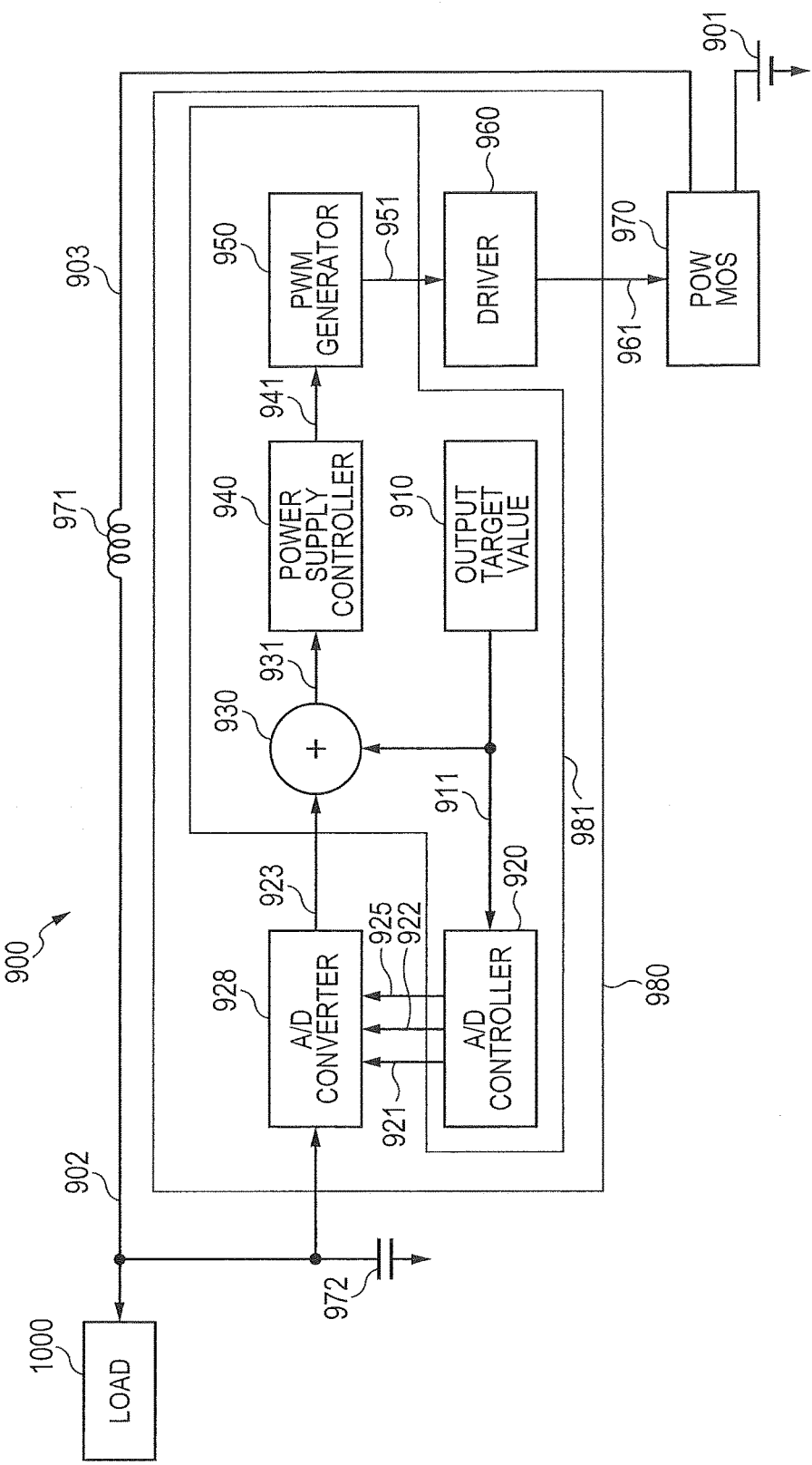
FIG. 11 is a block diagram showing an example of the structure of the digital control power supply device serving as the semiconductor device including an analog-digital converter of a fifth embodiment.

The structure of the semiconductor device including the analog-digital converter of the present embodiment is described next. FIG. 11 is a block diagram showing an example of the structure of the digital control power supply device 900 serving as the semiconductor device of the analog-digital converter 928 of the present embodiment. The digital control power supply device 900 serving as the semiconductor device of the present embodiment includes an output transistor 970, an analog-digital converter 928, a drive circuit 960, and a control circuit 981.

The analog-digital converter 928 is any of the analog-digital converter 200 of the first embodiment, the analog-digital converter 400 of the second embodiment, the analog-digital converter 500 of the third embodiment, and the analog-digital converter 600 of the fourth embodiment. The analog-digital converter 928 is input with a smoothing output voltage 902 (analog input signal 201), and is input with a clock signal 921, a reference voltage 922, and a control signal 925 (when the analog-digital converter is 400, 500, 600) from the control circuit 981, and outputs an analog-digital conversion output signal 923 (206).

The control circuit 981 controls the operation of the drive circuit 960. The control circuit 981 outputs a PWM signal 951 to control the driver circuit 960 based on the output target value 911 and the analog-digital conversion output signal 923, and outputs a clock signal 921, a reference voltage 922, and a control signal 925. The driver circuit 960 outputs a driver output signal 961 to drive the output transistor 970 coupled to the load 1000 based on the PWM signal 951 output from the control circuit 981.

The output transistor (POWMOS) 970 is coupled on one end to the DC power supply 901 and on the other end to the load 1000. The output transistor (POWMOS) 970 is controlled by turning the driver output signal 961 of the driver circuit 960 on and off, and outputs a digital control power supply output voltage 903 corresponding to the driver output signal 961. The digital control power supply output voltage 903 is smoothed by the inductor 971 and the condenser (capacitor) 972 and functions as the smoothing output voltage 902, and the input for the analog-digital converter 928 (200, 400, 500, 600).

The control circuit 981 contains an output target value register 910, and analog-digital controller 920, an adder 930, a power supply controller 940, and a PWM generator 950.

The output target value register 910 outputs an output target value 911 for the analog-digital conversion output signal 923 (analog-digital conversion output signal 206) to the analog-digital controller 920 and adder 930. The output target value 911 is a target value for the smoothing output voltage 902.

The analog-digital controller 920 outputs a clock signal 921 (202), reference voltage 922 (203) and control signal 925 (DSEL 401, VSEL 501, VA 601) based on the output target value 911. The control signal 925 in particular is set so that the voltage range including the output target value 911 and the voltage range of the delay cells 215 to 216 broadly match each other.

The adder 930 calculates the difference between the two quantities and outputs this difference as target value difference signal 931 based on the output target value 911 and the analog-digital conversion output signal 923 (206).

The power supply controller 940 outputs the calculated power supply control data 941 based on control such as PID (proportional, integral, derivative) and based on the target value difference signal 931.

The PWM generator 950 generates a PWM signal based on the power supply control data 941, and outputs this as a PWM signal 951.

The digital control power supply device may include the analog-digital converter 928 and the control circuit 981 within one semiconductor chip. Alternatively, the analog-digital converter 928, the control circuit 981, and the drive circuit 960 may be contained within one semiconductor chip as the control circuit 980. The control circuit 980 and the output transistor 970 may be contained in one semiconductor chip.

Figure 12:
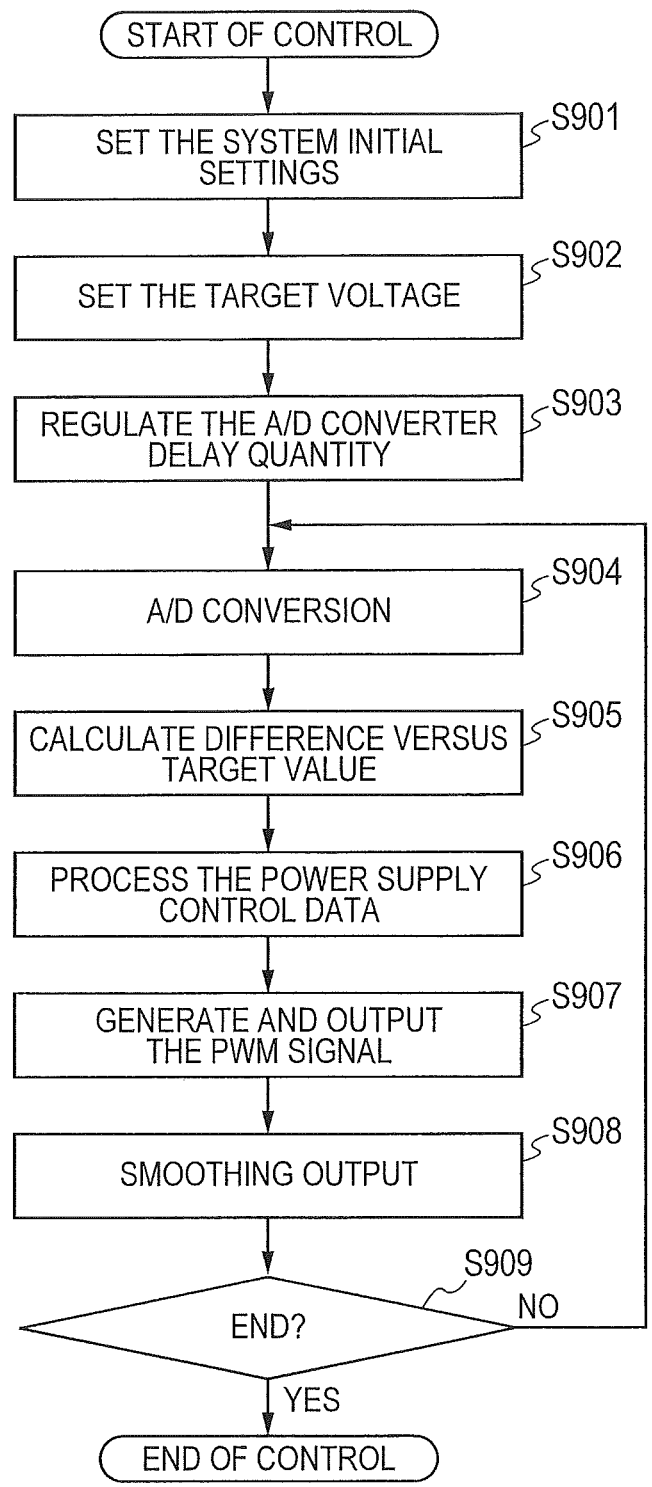
FIG. 12 is a flow chart showing the arithmetic processing by the digital control power supply device of the fifth embodiment.

The operation of the digital control power supply device of the present embodiment is described next. FIG. 12 is a flow chart showing the arithmetic processing (operation) by the digital control power supply device of the present embodiment.

An external control circuit for example sets each register and setting value in the digital control power supply device 900 to the initial state (step S901). The control circuit next sets the target value for the smoothing output voltage 902 as the output target value 911 of the output target value register 910 (step S902). The analog-digital controller 920 next adjusts and outputs the control signal 925 according to the output target value 911 (step S903). However, the analog-digital converter 928 changes the control signal 925. The control signal 925 is not used when utilizing the analog-digital converter 200 of the first embodiment. When using the analog-digital converter 400 of the second embodiment, the control signal 925 is a signal corresponding to DSEL 401. When using the analog-digital converter 500 of the third embodiment, the control signal 925 is a signal corresponding to the VSEL 501. When using the analog-digital converter 600 of the fourth embodiment, the control signal 925 is a signal corresponding to the VA 601.

The analog-digital converter 928 adjusts the delay quantity based on the control signal 925, and performs analog-digital conversion based on the reference voltage 922 (203) and the clock signal 921 (202) generated by the analog-digital controller 920 and the smoothing output voltage 902 (analog input signal 201). The analog-digital converter 928 outputs the results of that analog-digital conversion as the analog-digital conversion output signal 923 (206) (step S904)

The adder 930 find the coded difference between the two inputs based on the output target value 911 and the analog-digital conversion output signal 923, and outputs the target value difference signal 931 (step S905). The power supply controller 940 calculates the duty value of the PWM signal generated by the PWM generator 950 by digital processing such as by PID control and the processing by the digital filter based on the target value difference signal 931. The power supply controller 940 then outputs those processing results to the PWM generator 950 as the power supply control data 941 (step S906). The PWM generator 950 converts the duty value shown in the power supply control data 941 to a PWM waveform and output this as a PWM signal 951 to the driver circuit 960. The driver circuit 960 generates a driver output signal 961 to drive the output transistor 970 serving as the load based on the PWN signal 951, and outputs this driver output signal 961 to the output transistor 970 (step S907).

The output transistor 970 outputs a digital control power supply output voltage 903 corresponding to the driver output signal 961 (high-level output voltage is dependent on the DC power supply 901). The digital control power supply output voltage 903 smoothed by the inductor 971 and the condenser (capacitor) 972 resulting in the smoothing output voltage 902 serves as the output power supply voltage, and the input for the analog-digital converter 928 (step S908).

Next, the analog-digital controller 920 decides whether or not to end the sequence from step S904 to step S908 (step s909). If not ending the sequence (NO in step S909), the operation returns to step S904; and if ending the sequence (YES in step S909) the control is terminated.

Figure 13:
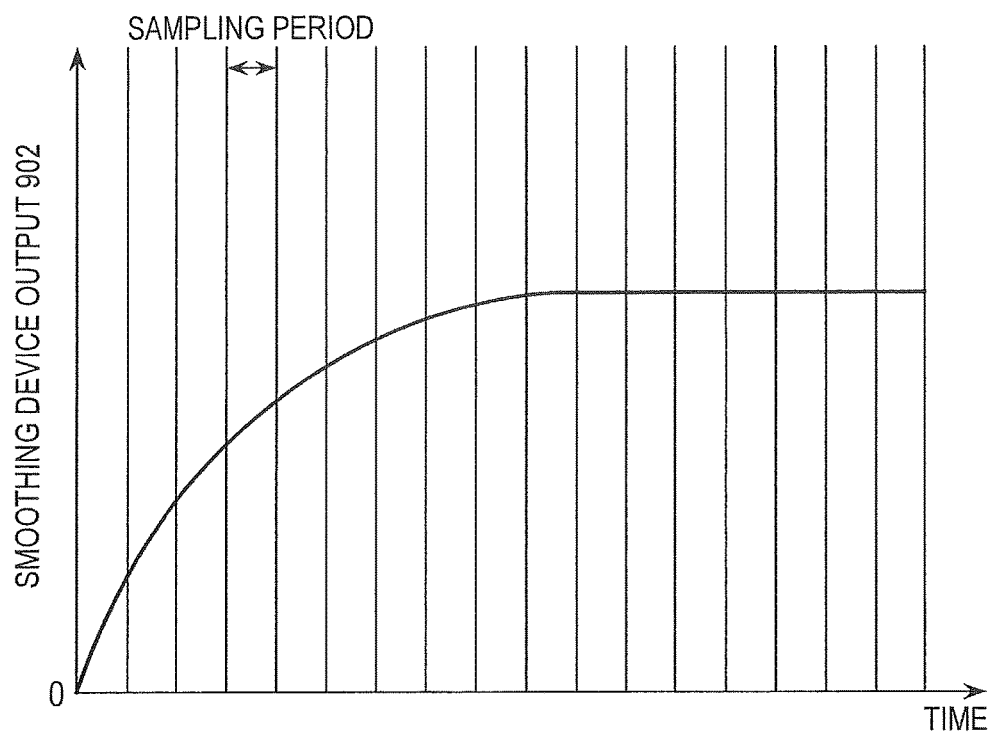
FIG. 13 is a graph showing the transient characteristics of the smoothing output voltage when utilizing the digital control power supply device of the fifth embodiment.
Figure 14:
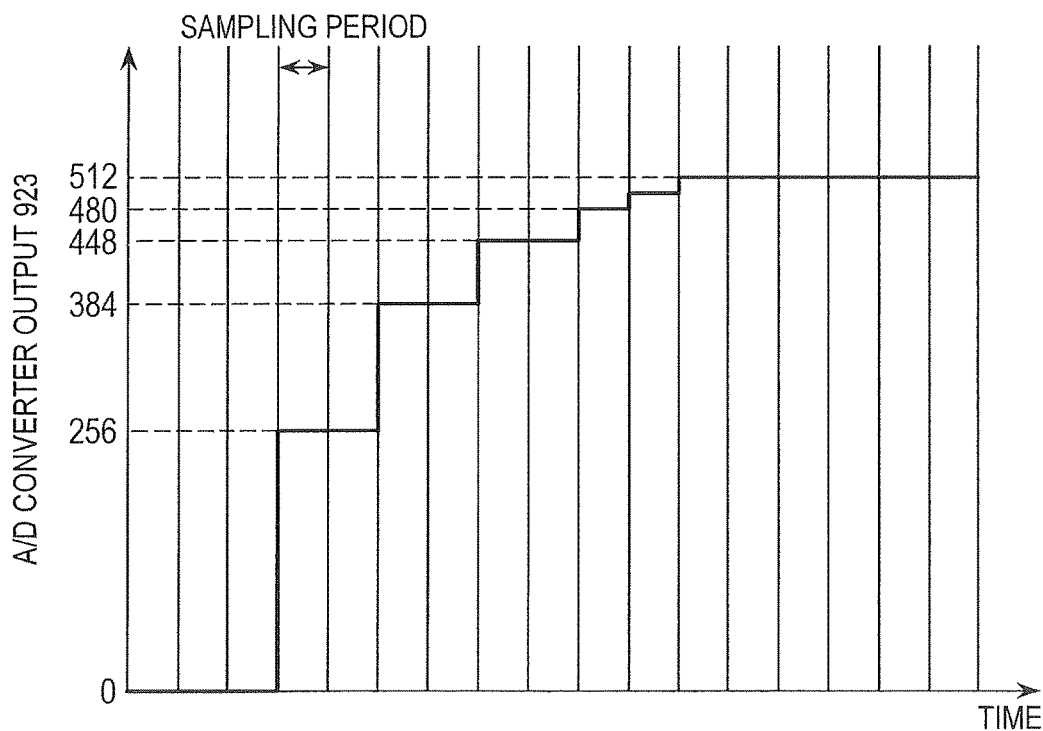
FIG. 14 is a graph showing the transient characteristics of the analog-digital converter output when utilizing the digital control power supply device of the fifth embodiment.

FIG. 13 is a graph showing the transient characteristics of the smoothing output voltage when utilizing the digital control power supply device of the present embodiment. The horizontal axis shows the time, and the vertical axis shows the smoothing output voltage 902. FIG. 14 is a graph showing the transient characteristics of the analog-digital converter output utilizing the digital control power supply device of the present embodiment. The horizontal axis shows the time, and the vertical axis shows the analog-digital conversion output signal 923. The example in this figure shows the case where the expectation value of the analog-digital conversion output signal 923 is 512.

In these figures, the lines parallel to the vertical axis shows the sampling period of the analog-digital converter. The time 0 on the horizontal axis indicates the initially implemented step S904. The operation from step S904 to step S908 is repeatedly implemented in each sampling period.

For example in the analog-digital converter 400 of the second embodiment, the smoothing output voltage 902 is sampled at each sampling period, and analog-digital conversion is performed. In the analog-digital converter 400 of the second embodiment, when the delay quantity of the DSEL 401 is medium (td2), the ratios of the delay quantity in the delay cell array 210 are listed in order from the beginning as: 256, 128, 64, 32, 1 . . . 1 (64 items), 32, 64, 128, 256. The analog-digital conversion output signal 923 when the smoothing output voltage 902 in FIG. 13 is input is therefore converged into the target value 512, while showing the conversion characteristics such as shown in FIG. 14. In this case, high bit accuracy is required in the range in the vicinity of the target value, however in all other ranges, a high bit accuracy is not so essential. The present embodiment is therefore capable of raising the bit accuracy in the vicinity of the target value, and drastically reducing the circuit surface area, by increasing the bit accuracy in a range near the target value, and lowering the bit accuracy to a relatively low amount in all other ranges.

In the present embodiment, applying the analog-digital converter of any of the first through the fourth embodiments to the digital control power supply device 900 allows reducing the surface area of the analog-digital converter itself approximately 90 percent compared to the analog-digital converters utilizing TDC of the related art. The reason for this large reduction is the same as described in the first embodiment. Also, applying the analog-digital converter of any of the first through the fourth embodiments to the digital control power supply device 900, reduces the power consumption along with reducing the number of elements in the analog-digital converter, and allows boosting the conversion efficiency as a digital control power supply device.

Sixth Embodiment

The semiconductor device including the analog-digital converter of the present embodiment is described next. The present embodiment differs from the first through the fourth embodiments in the point that the analog-digital converter described in any of the first through the fourth embodiment is applicable to a transceiver device for wireless communication. Hereafter, the following description mainly covers that differing point.

Figure 15:
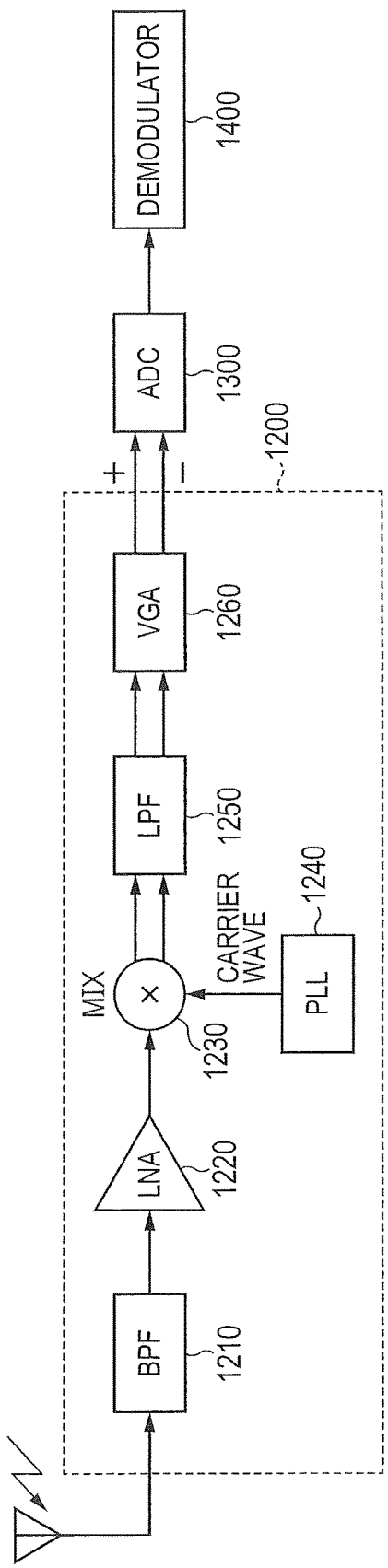
FIG. 15 is a block diagram showing an example of the structure of the transceiver device for wireless communication serving as the semiconductor device including an analog-digital converter of a sixth embodiment.

The structure of the semiconductor device including the analog-digital converter of the present embodiment is described next. FIG. 15 is a block diagram showing an example of the structure of the transceiver device 1100 for wireless communication serving as the semiconductor device containing an analog-digital converter 1300 of the present embodiment. The example in this figure only shows the structure up to the demodulator on the receive side. The transceiver device 1100 for the wireless communication utilized as the semiconductor device of the present embodiment includes an analog receiver unit 1200, an analog-digital converter 1300, and a demodulator 1400.

The analog receiver unit 1200 includes a BPF (Band-Pass Filter) 1210, a LNA (Low Noise Amplifier) 1220, MIX (Mixer) 1230, PLL (Phase-Locked Loop) 1240, LPF (Low-Pass Filter) 1250, and a VGA (Variable Gain Amplifier) 1260. The analog receiver unit 1200 processes the radio (wireless) signals received at the antenna, and outputs analog receive signals on the positive side, and analog receive signals on the negative side.

The analog-digital converter 1300 is any of the analog-digital converter 200 of the first embodiment, the analog-digital converter 400 of the second embodiment, the analog-digital converter 500 of the third embodiment, or the analog-digital converter 600 of the fourth embodiment. However, the analog-digital converter 1300 includes two systems for the positive side and the negative side. The positive side analog-digital converter 1300 performs analog-digital conversion of the positive side analog receive signals (analog input signal 201), and outputs the positive side analog-digital conversion output signals (206) to the demodulator 1400. The negative side analog-digital converter 1300 in the same way, performs analog-digital conversion of the negative side analog receive signals (analog input signal 201), and outputs these signal as the negative side analog-digital conversion output signals (206) to the demodulator 1400. However, the clock signal (202), reference voltage (203), control signals (DSEL 401 (analog-digital converter 400)), VSEL 501 (analog-digital converter 500), and VA601 (analog-digital converter 600) are supplied for example from a control circuit not shown in the drawings.

The demodulator 1400 demodulates the receive signals based on the positive side analog-digital conversion output signals (206) and the negative side analog-digital conversion output signals (206).

Figure 16:
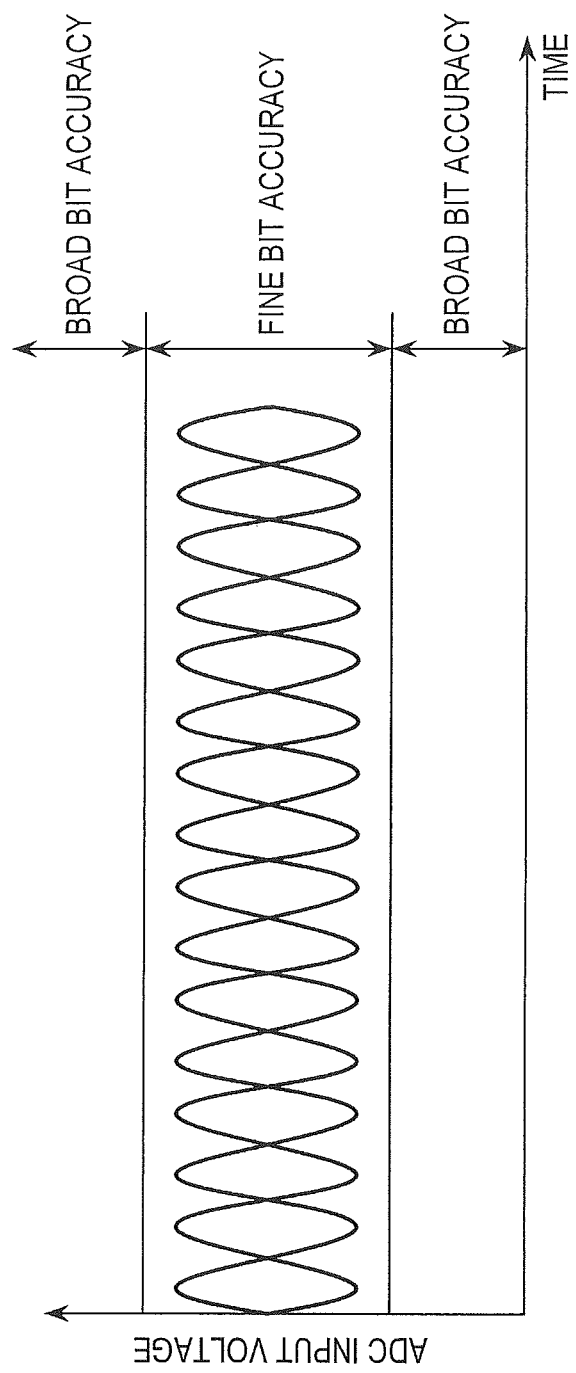
FIG. 16 is a graph showing the time variations (time change?) in the input voltage in the analog-digital converter of the sixth embodiment.

FIG. 16 is a graph showing the time variations in the input voltage in the analog-digital converter 1300 of the present embodiment. The vertical axis shows the input voltage of the analog input signal to the analog-digital converter 1300 and the horizontal axis shows the time. The analog receiver unit 1200 decides the output range of the analog receive signals output from the VGA 1260. This output range is the voltage range required for high bit accuracy in the analog-digital converter 1300. The analog-digital converter 1300 is therefore used with this voltage range set (adjusted) to cover the input range having high bit accuracy in the analog-digital converter 1300. High bit accuracy is in this way required in the output range for analog receive signals however such a high bit accuracy is not required in all other ranges. The present embodiment is therefore capable of raising the bit accuracy in the output range of the analog receive signal, and reducing the bit accuracy to a relatively low amount in all other ranges so that the present embodiment is capable of raising the bit accuracy in the range where needed and drastically reducing the overall circuit surface area.

In the present embodiment, applying the analog-digital converter of any of the first through the fourth embodiments to the transceiver device 1100 for wireless communication allows reducing the surface area of the analog-digital converter itself approximately 90 percent compared to analog-digital converters utilizing TDC of the related art. The reason for this large reduction is the same as described in the first embodiment. Also, applying the analog-digital converter of any of the first through the fourth embodiments to the transceiver device 1100 for wireless communication, reduces the power consumption along with reducing the number of elements in the analog-digital converter and is also satisfactory for suppressing battery wear particularly in hand-held devices.

The invention rendered by the present inventors is described based on the embodiments, however the present invention is not limited by the embodiments of the present invention and needless to say, all manner of modifications and adaptations not departing from the spirit and scope of the present invention are permissible.

What is claimed is:

1. A semiconductor device comprising:
    an analog-digital converter circuit,
    wherein the analog-digital converter circuit includes:
        a delay cell array that contains n-number (n is a natural number of 2 or more) of serially-coupled delay cells, receives a reference clock signal, and utilizes an analog input signal as the power supply voltage for delay cells in each stage;
        a weighting encoder that encodes the output signals of the delay cells in each stage of the delay cell array to encode signals; and
        a binary conversion encoder that convert the encode signals to analog-digital converter output signal,
    wherein the n-number of delay cells include a delay quantity weighted for each delay cell,
    wherein the weighting encoder encodes the output signal of the delay cell in each stage of the delay cell array by weighting corresponding to the number of delay cell stages and part of the encode signals whose number corresponds to the number of delay cell stases,
    wherein the binary conversion encoder encodes the encode signals,
    wherein the first stage of the delay cell for the delay cell array increases or reduces the delay quantity of the first stage of the delay cell in response to a delay quantity control signal that regulates the delay quantity, and
    wherein the weighting encoder changes the weighting corresponding to the number of delay cell stages for each n-number of delay cells in response to the delay quantity control signal.

2. The semiconductor device according to claim 1, further comprising;
    a latch array that includes n number of flip-flops to latch n number of delay cell output signals in response to common delay clock signals; and
    a latch signal encoder that encodes the latch signal of the flip-flop in each stage for the latch array by weighting corresponding to the number of delay cell stages.

3. The semiconductor device according to claim 2, wherein the output timing of the delay clock signal can be changed, and
    wherein the latch signal encoder changes the weighting corresponding to the number of delay cell stages for each number of delay cells in response to the change in the output timing of the delay clock signal.

4. The semiconductor device according to claim 3, further comprising;
    a delay circuit that outputs the delay clock signal,
    wherein the delay circuit speeds up or delays the output timing of the delay clock signal in response to the reference voltage circuit delay quantity control signal that regulates the output timing of the delay clock signal, and
    wherein the latch signal encoder changes the weighting corresponding to the number of delay cell stages for each number of delay cells in response to the reference voltage circuit delay quantity control signal.

5. The semiconductor device according to claim 3, further comprising;
    a delay circuit that outputs the delay clock signal; and
    a power supply voltage control circuit that outputs a reference voltage to regulate the output timing of the delay clock signal as the power supply voltage for the delay circuit,
    wherein the latch signal encoder changes the weighting corresponding to the number of delay cell stages for each n-number of delay cells in response to a reference voltage notification signal corresponding to the size of the reference voltage.

6. The semiconductor device according to claim 1, wherein at least a portion of then number of delay cells have a different delay quantity weighted for each of the portion of then number of delay cells.

7. The semiconductor device according to claim 1, wherein the delay cells having above a predetermined delay quantity contain delay quantities corresponding to plural bits,
    wherein the delay cell is defined as containing a delay quantity corresponding to one bit as a unit delay cell, and a delay cell is defined as containing a delay quantity corresponding to plural bits as one delay cell which functions identical to plural unit delay cells, and
    wherein then number of delay cells have a variable delay quantity weighted for each of delay cells.

8. The semiconductor device according to claim 1, wherein the weighted encoder encodes weighting signals output from the each stage of the delay cells by weighting that corresponds to the number of stages of the delay cells.

9. The semiconductor device according to claim 1, wherein the n number of delay cells have a different delay quantity weighted for each of the delay cells.

10. A semiconductor device comprising:
    an analog-digital converter circuit,
    wherein the analog-digital converter circuit includes:
        a delay cell array that contains n-number (n is a natural number of 2 or more) of serially-coupled delay cells, receives a reference clock signal, and utilizes an analog input signal as the power supply voltage for delay cells in each stage;
        a weighting encoder that encodes the output signals of the delay cells in each stage of the delay cell array to encode signals;
        a binary conversion encoder that convert the encode signals to analog-digital converter output signal,
    wherein the n-number of delay cells include a delay quantity weighted for each delay cell,
    wherein the weighting encoder encodes the output signal of the delay cell in each stage of the delay cell array by weighting corresponding to the number of delay cell stages and part of the encode signals whose number corresponds to the number of delay cell stages, and wherein the binary conversion encoder encodes the encode signals;

a driver circuit that drives the output transistor; and a control circuit that regulates the driver circuit, wherein the analog-digital conversion circuit utilizes the output voltage of the output transistor as an analog input signal, and outputs a digital output signal, and wherein the control circuit outputs a control signal that regulates the driver circuit based on the digital output signal and the output target value.

11. The semiconductor device according to claim 10, further comprising:

an analog receiver unit that processes a wireless signal received at an antenna, and outputs an analog receive signal; and a demodulator, wherein the analog-digital conversion circuit utilizes the analog receive signal as the analog input signal, and outputs a digital output signal, and wherein the demodulator demodulates the digital output signal.

12. An operating method for the semiconductor, the semiconductor device including:

an analog-digital converter circuit, the analog-digital converter circuit including:

a delay cell array that includes n-number (n is a natural number of 2 or more) of serially-coupled delay cells; and an encoder, and the n number of delay cells including the delay quantity weighted for each of the delay cells, the operating method for the semiconductor device comprising:

inputting a reference clock signal and utilizing the analog input signal as the power supply voltage for each delay cell stage by way of the delay cell array; and encoding the output signal of the delay cell in each stage for the delay cell array to encode signals of corresponding number to weighting, binary converting the encode signals, and outputting the binary converted output signal as a digital output signal, wherein the semiconductor device further including a driver circuit and a control circuit, the operating method further comprising:

inputting the output voltage of the output transistor as an analog input signal, and outputting the digital output signal by way of the analog-digital converter circuit;

outputting a control signal by way the control circuit that controls the driver circuit based on the digital output signal and the output target value; and driving the output transistor by the driver circuit.

13. The operating method for the semiconductor device according to claim 12, the semiconductor device further including an analog receiver unit and a demodulator, the operating method further comprising:

processing a wireless signal received at an antenna, and outputting the analog receive signals by way of the analog receiver unit;

inputting the analog receive signal as the analog input signal, and outputting the digital output signals by way of the analog-digital converter circuit; and demodulating the digital output signals in the demodulator.

* * * * *